(12) United States Patent
Ikenaga et al.

(10) Patent No.: US 10,541,387 B2
(45) Date of Patent: Jan. 21, 2020

(54) DEPOSITION MASK, METHOD OF MANUFACTURING DEPOSITION MASK AND METAL PLATE

(71) Applicant: Dai Nippon Printing Co., Ltd., Tokyo (JP)

(72) Inventors: Chikao Ikenaga, Tokyo (JP); Yo Shimazaki, Tokyo (JP); Kentarou Seki, Tokyo (JP); Hiroki Furushou, Tokyo (JP); Chiaki Hatsuta, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 15/987,152

(22) Filed: May 23, 2018

(65) Prior Publication Data

US 2018/0277799 A1 Sep. 27, 2018

Related U.S. Application Data

(63) Continuation of application No. 15/763,595, filed as application No. PCT/JP2016/078899 on Sep. 29, 2016.

(30) Foreign Application Priority Data

Sep. 30, 2015 (JP) .................................. 2015-194295
Sep. 30, 2015 (JP) .................................. 2015-194316

(Continued)

(51) Int. Cl.
*H01L 51/56* (2006.01)
*C23C 14/04* (2006.01)

(Continued)

(52) U.S. Cl.
CPC ............ *H01L 51/56* (2013.01); *C23C 14/042* (2013.01); *C23C 14/24* (2013.01); *C23C 16/042* (2013.01);

(Continued)

(58) Field of Classification Search
None
See application file for complete search history.

(56) References Cited

U.S. PATENT DOCUMENTS

| 4,549,939 A | 10/1985 | Kenworthy et al. |
| 4,676,193 A | 6/1987 | Martin |

(Continued)

FOREIGN PATENT DOCUMENTS

| CN | 100354752 C | 12/2007 |
| CN | 100517796 C | 7/2009 |

(Continued)

OTHER PUBLICATIONS

Davis, J.R.. (1998). Metals Handbook, Desk Edition (2nd Edition). (pp. 609-615). ASM International. Retrieved from https://app.knovel.com/hotlink/toc/id:kpMHDEE004/metals-handbook-desk/metals-handbook-desk (Year: 1998).*

(Continued)

*Primary Examiner* — Binu Thomas
(74) *Attorney, Agent, or Firm* — Burr & Brown, PLLC

(57) ABSTRACT

A deposition mask includes a mask body and a through-hole provided in the mask body and through which a deposition material passes when the deposition material is deposited on a deposition target substrate. The mask body satisfies y≥950 and y≥23x−1280 when an indentation elastic modulus is x (GPa) and a 0.2% yield strength is y (MPa). When the mask body satisfies these inequalities, the generation of recesses during ultrasonic cleaning of the mask can be suppressed.

18 Claims, 22 Drawing Sheets

(30) Foreign Application Priority Data

Jul. 13, 2016 (JP) .................................. 2016-138883
Jul. 14, 2016 (JP) .................................. 2016-139523

(51) Int. Cl.

| | | |
|---|---|---|
| C25D 1/10 | (2006.01) | |
| C23C 16/04 | (2006.01) | |
| C25D 5/02 | (2006.01) | |
| H01L 51/50 | (2006.01) | |
| C25D 1/08 | (2006.01) | |
| H01L 51/00 | (2006.01) | |
| C23C 18/16 | (2006.01) | |
| C23C 14/24 | (2006.01) | |
| C23F 1/02 | (2006.01) | |
| C23C 18/32 | (2006.01) | |
| B23K 26/073 | (2006.01) | |
| C22C 38/10 | (2006.01) | |
| C25D 5/12 | (2006.01) | |
| C25D 3/16 | (2006.01) | |

(52) U.S. Cl.
CPC ...... *C23C 18/1605* (2013.01); *C23C 18/1651* (2013.01); *C23C 18/1653* (2013.01); *C23C 18/1657* (2013.01); *C23C 18/32* (2013.01); *C23F 1/02* (2013.01); *C25D 1/08* (2013.01); *C25D 1/10* (2013.01); *C25D 5/022* (2013.01); *H01L 51/0011* (2013.01); *H01L 51/5012* (2013.01); *B23K 26/073* (2013.01); *C22C 38/105* (2013.01); *C25D 3/16* (2013.01); *C25D 5/12* (2013.01)

(56) References Cited

U.S. PATENT DOCUMENTS

| | | | |
|---|---|---|---|
| 4,762,595 A | | 8/1988 | Postuack et al. |
| 6,296,711 B1 | | 10/2001 | Loan et al. |
| 2003/0221613 A1* | | 12/2003 | Kang ................... C25D 1/10 |
| | | | 118/504 |
| 2004/0021410 A1* | | 2/2004 | Stagnitto ............ C23C 14/042 |
| | | | 313/407 |
| 2006/0037671 A1* | | 2/2006 | Park .................... C25D 3/562 |
| | | | 205/365 |

FOREIGN PATENT DOCUMENTS

| | | |
|---|---|---|
| CN | 107208251 A | 9/2017 |
| JP | S61-009592 A1 | 1/1986 |
| JP | 2001-234385 A1 | 8/2001 |
| JP | 2005-154879 A1 | 6/2005 |
| JP | 2006-164815 A1 | 6/2006 |
| JP | 2007-234248 A1 | 9/2007 |
| JP | 2011-177664 | 9/2011 |
| JP | 5382259 B1 | 1/2014 |
| JP | 2015-067892 | 4/2015 |
| JP | 2016-148113 A1 | 8/2016 |
| WO | 2014/176163 A1 | 10/2014 |

OTHER PUBLICATIONS

Incoloy® alloy 903 Data Sheet from Special Metals Corporation (Year: 2004).*
Incoloy® alloy 907 Data Sheet from Special Metals Corporation (Year: 2004).*
Japanese Office Action (Application No. 2016-564655) dated Apr. 27, 2018 (with English Translation).
International Search Report and Written Opinion (Application No. PCT/JP2016/078899) dated Dec. 13, 2016.
Japanese Office Action (Application No. 2016-564655) dated Dec. 19, 2017 (with English translation).
English translation of International Preliminary Report on Patentability (Chapter I) (Application No. PCT/JP2016/078899) dated Apr. 12, 2018.
Chinese Office Action (Application No. 201680056410.5) dated Jun. 19, 2019 (with English translation).
Partial Supplementary European Search Report, European Application No. 16851792.8, dated Sep. 16, 2019 (16 pages).
Anonymous, "36% Nickel-Iron Alloy for Low Temperature Service," dated Jan. 1, 2014, retrieved from the Internet: URL:https://www.spacematdb.com/spacemat/manudatasheets/invar36-from%20Ni%20institute.pdf (8 pages).
Poza, P. et al., "Mechanical Properties of Inconel 625 cold-sprayed coatings after laser remelting. Depth Sensing Indentation analysis", Surface and Coatings Technology, vol. 243, pp. 51-57, XP028637465, ISSN: 0257-8972, DOI: 10.1016/J.SURFCOAT.2012.03.018, 7 pages.
European Supplementary Search Report and Annex to the European Search Report from a corresponding European patent application (EP 16851792.8) dated Nov. 29, 2019, 16 pages.

\* cited by examiner

DEPOSITION MASK, METHOD OF MANUFACTURING DEPOSITION MASK AND METAL PLATE

TECHNICAL FIELD

The present invention relates to a deposition mask having a plurality of through-holes formed therein, a method of manufacturing a deposition mask, and a metal plate used to manufacture a deposition mask.

BACKGROUND ART

In recent years, it is required for display devices used in portable devices, such as a smartphone and a tablet PC, to have high definition, for example, a pixel density of 400 ppi or higher. In addition, there is an increasing demand for adapting to ultra full high vision even with respect to the portable devices. In this case, it is required for the display devices to have a pixel density of, for example, 800 ppi or higher.

Among the display devices, an organic EL display device has drawn attention due to good responsiveness, low power consumption, and high contrast. As a method of forming pixels of the organic EL display device, a method of forming pixels in a desired pattern using a deposition mask having through-holes arranged in a desired pattern is known. Specifically, first, the deposition mask is brought into close contact with an organic EL substrate (deposition target substrate) for the organic EL display device, and then, a deposition step of introducing both the deposition mask and the organic EL substrate, in close contact with each other, into the deposition device to cause an organic material to be deposited on the organic EL substrate. In this case, it is required to precisely reproduce a position and a shape of the through-hole of the deposition mask in accordance with a design and to reduce a thickness of the deposition mask in order to precisely prepare the organic EL display device having a high pixel density.

As a method of manufacturing the deposition mask, a method of forming a through-hole in a metal plate by etching using a photolithography technique is known, for example, as disclosed in Patent Document 1. For example, a first resist pattern is first formed on a first surface of the metal plate, and a second resist pattern is formed on a second surface of the metal plate. Next, a region of the first surface of the metal plate that is not covered with the first resist pattern is etched to form a first opening on the first surface of the metal plate. Thereafter, a region of the second surface of the metal plate that is not covered with the second resist pattern is etched to form a second opening on the second surface of the metal plate. At this time, it is possible to form the through-hole penetrating the metal plate by performing etching such that the first opening and the second opening communicate with each other.

In addition, as the method of manufacturing the deposition mask, a method of manufacturing a deposition mask using a plating process is known, for example, as disclosed in Patent Document 2. For example, a base material having conductivity is produced first in the method described in Patent Document 2. Next, a resist pattern is formed on the base material with a predetermined gap therebetween. This resist pattern is provided at positions where through-holes of the deposition mask need to be formed. Thereafter, a plating solution is supplied to the gap of the resist pattern to precipitate a metal layer on the base material by an electrolytic plating process. Thereafter, the deposition mask having the plurality of through-holes formed therein can be obtained by separating the metal layer from the base material.

Patent Document 1: JP 5382259 B2
Patent Document 2: JP 2001-234385 A

DISCLOSURE OF THE INVENTION

Meanwhile, a deposition material tends to adhere to the deposition mask after performing a deposition step on the organic EL substrate. The adhering deposition material becomes shadow, and can lower the utilization efficiency of the deposition material at the time of performing the subsequent deposition step. Accordingly, there is a case where ultrasonic cleaning of the deposition mask is performed in order to remove the adhering deposition material. In this case, there is a possibility that both faces of the deposition mask are deformed by ultrasonic waves emitted at the time of cleaning so that a recess is formed.

Meanwhile, there is a case where an aperture ratio of the deposition mask is increased or the thickness of the deposition mask is decreased in order to increase the pixel density as described above. In this case, there is a possibility that the strength of the deposition mask against the ultrasonic cleaning is lowered so that the recess is formed on both the faces of the deposition mask. When such recesses are formed, it is also considered that the deposition mask is likely to be broken due to cavitation generated during the ultrasonic cleaning.

The present invention has been made in consideration of such problems, and an object thereof is to provide a deposition mask, a method of manufacturing a deposition mask, and a metal plate capable of suppressing deformation during ultrasonic cleaning.

The present invention is
a deposition mask for depositing a deposition material on a deposition target substrate, the deposition mask including
a mask body and
a through-hole provided in the mask body and through which the deposition material passes when the deposition material is deposited on the deposition target substrate, in which
the mask body satisfies $y \geq 950$ and $y \geq 23x - 1280$ when an indentation elastic modulus is x (in gigapascals ("GPa")) and a 0.2% yield strength is y (in megapascals ("MPa")).

In addition, the present invention is
a deposition mask for depositing a deposition material on a deposition target substrate, the deposition mask including
a mask body and
a through-hole provided in the mask body and through which the deposition material passes when the deposition material is deposited on the deposition target substrate, in which
the mask body satisfies $z \geq 3.7$ and $z \geq 0.1x - 6.0$ when an indentation elastic modulus is x (GPa) and an indentation hardness is z (GPa).

In the deposition mask according to the present invention, a thickness of the mask body may be 15 μm or less.

In the deposition mask according to the present invention, the deposition mask may be produced by a plating process.

In the deposition mask according to the present invention, the mask body may have a first metal layer and a second metal layer provided on the first metal layer.

In addition, the present invention is a method of manufacturing a deposition mask for depositing a deposition material on a deposition target substrate, the method including a step of forming a mask body, provided with a through-hole through which the deposition material passes when the deposition material is deposited on the deposition target substrate, on a base material by a plating process and a step of separating the mask body from the base material, in which the mask body satisfies $$y \geq 950 \text{ and } y \geq 23x-1280$$

when an indentation elastic modulus is x (GPa) and a 0.2% yield strength is y (MPa).

In addition, the present invention is a method of manufacturing a deposition mask for depositing a deposition material on a deposition target substrate, the method including a step of forming a mask body, provided with a through-hole through which the deposition material passes when the deposition material is deposited on the deposition target substrate, on a base material by a plating process and a step of separating the mask body from the base material, in which the mask body satisfies $$z \geq 3.7 \text{ and } z \geq 0.1x-6.0$$

when an indentation elastic modulus is x (GPa) and an indentation hardness is z (GPa).

In the method of manufacturing a deposition mask according to the present invention, the step of forming the mask body may include a first film formation step of forming a first metal layer provided with a first opening forming the through-hole and a second film formation step of forming a second metal layer provided with a second opening communicating with the first opening on the first metal layer, the second film formation step to obtain the mask body having the first metal layer and the second metal layer.

In the method of manufacturing a deposition mask according to the present invention, the second film formation step may include a resist formation step of forming a resist pattern on the base material and on the first metal layer with a predetermined gap therebetween and a plating process step of precipitating the second metal layer on the first metal layer in the gap of the resist pattern, and the resist formation step may be performed such that the first opening of the first metal layer is covered with the resist pattern and the gap of the resist pattern is positioned on the first metal layer.

In the method of manufacturing a deposition mask according to the present invention, the plating process step of the second film formation step may include an electrolytic plating process step of causing an electric current to flow through the first metal layer to precipitate the second metal layer on the first metal layer.

In the method of manufacturing a deposition mask according to the present invention, the base material may have an insulating property, a conductive pattern having a pattern corresponding to the first metal layer may be formed on the base material, and the first film formation step may include a plating process step of precipitating the first metal layer on the conductive pattern.

In the method of manufacturing a deposition mask according to the present invention, the plating process step of the first film formation step may include an electrolytic plating process step of causing an electric current to flow through the conductive pattern to precipitate the first metal layer on the conductive pattern.

In the method of manufacturing a deposition mask according to the present invention, the first film formation step may include a resist formation step of forming a resist pattern on the base material with a predetermined gap therebetween and a plating process step of precipitating the first metal layer on the base material in the gap of the resist pattern, and a portion of a front surface of the base material on which the first metal layer is precipitated may be formed of a conductive layer having conductivity.

In the method of manufacturing a deposition mask according to the present invention, the plating process step of the first film formation step may include an electrolytic plating process step of causing an electric current to flow through the base material to precipitate the first metal layer on the base material.

In addition, the present invention is a metal plate used to manufacture a deposition mask for depositing a deposition material on a deposition target substrate, the metal plate satisfying $$y \geq 950 \text{ and } y \div 23x-1280$$

when an indentation elastic modulus is x (GPa) and a 0.2% yield strength is y (MPa).

In addition, the present invention is a metal plate used to manufacture a deposition mask for depositing a deposition material on a deposition target substrate, the metal plate satisfying $$z \geq 3.7 \text{ and } z \geq 0.1x-6.0$$

when an indentation elastic modulus is x (GPa) and an indentation hardness is z (GPa).

According to the present invention, it is possible to suppress deformation during ultrasonic cleaning.

DESCRIPTION OF EMBODIMENTS

Figure 1:
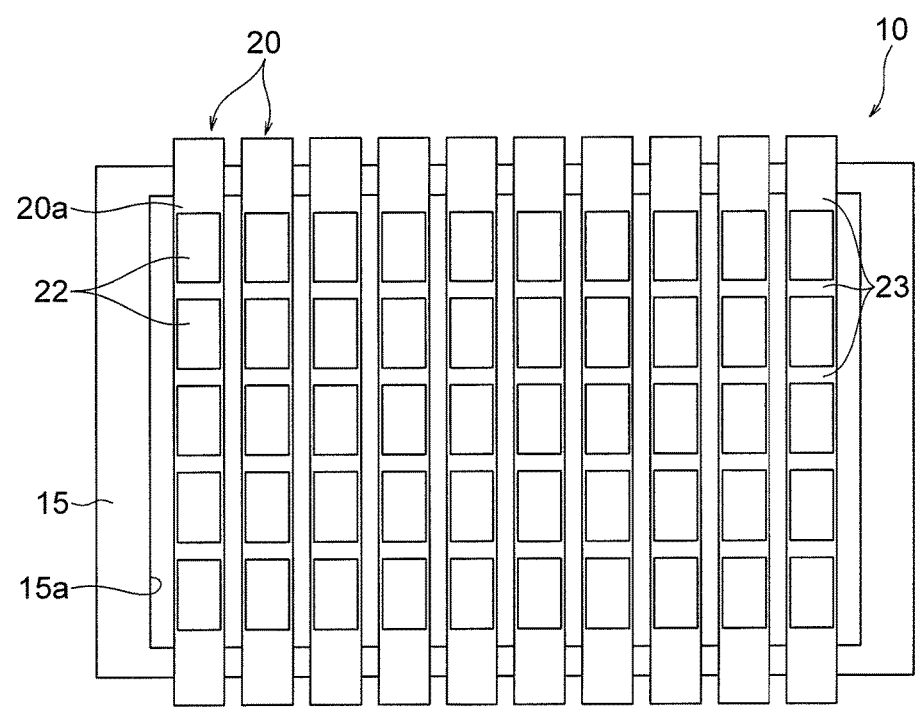
FIG. 1 is a schematic plan view illustrating an example of a deposition mask device including a deposition mask in an embodiment of the present invention.

Hereinafter, an embodiment of the present invention will be described with reference to the drawings. Incidentally, in the drawings appended to the present specification, scales and horizontal and vertical dimension ratios and the like are appropriately changed and exaggerated as compared to actual ones thereof in order for convenience of illustration and facilitating the understanding.

FIGS. 1 to 33 are views for describing the embodiment according to the present invention and a modification thereof. In the following embodiment and modifications thereof, a description will be given by exemplifying a deposition mask, a method of manufacturing a deposition mask, and a metal plate used for patterning of an organic material in a desired pattern on a substrate when manufacturing an organic EL display device. However, the present invention is not limited to such applications but can be applied to deposition masks, methods of manufacturing a deposition mask, and metal plates used for various purposes.

Incidentally, in the present specification, the terms "plate", "sheet", and "film" are not distinguished from each other based solely on differences in nomenclature. For example, the "plate" is a concept that also includes a member which can be called a sheet or a film.

In addition, the "plate plane (a sheet plane or a film plane)" indicates a surface that coincides with a plane direction of a target plate-like member (a sheet-like member or a film-like member) in a case where the target plate-like (sheet-like or film-like) member is viewed widely as a whole. In addition, a normal direction used with respect to the plate-like (sheet-like or film-like) member indicates a normal direction with respect to the plate plane (the sheet plane or the film plane) of the member.

In addition, terms, lengths, angles, and values of physical characteristics specifying shapes, geometric conditions, physical characteristics, and extent thereof used in the present specification (for example, the terms such as "parallel", "orthogonal", "same", and "equivalent") are interpreted including a range of extent where similar functions can be expected without being bound by strict meaning.

(Deposition Mask Device)

Figure 2:
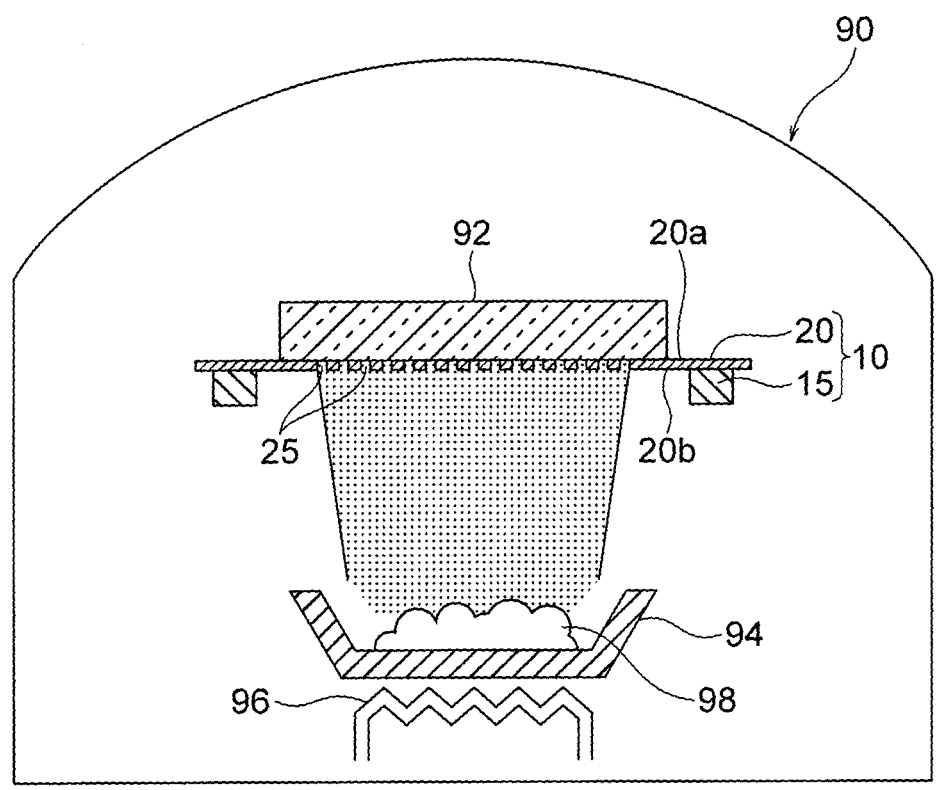
FIG. 2 is a view for describing a deposition method using the deposition mask device illustrated in FIG. 1.
Figure 3:
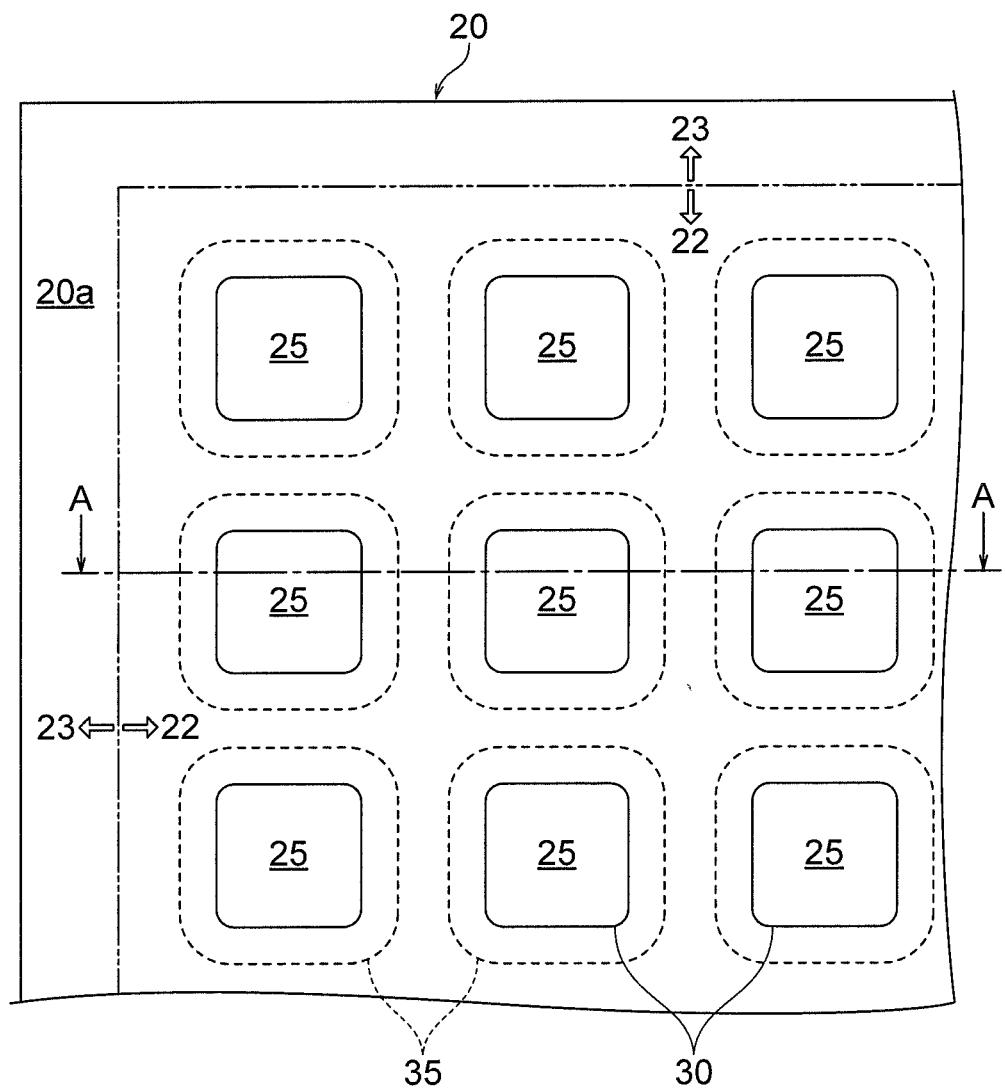
FIG. 3 is a partial plan view illustrating the deposition mask illustrated in FIG. 1.

First, an example of a deposition mask device including a deposition mask will be described with reference to FIGS. 1 to 3. Here, FIG. 1 is a plan view illustrating the example of the deposition mask device including the deposition mask, and FIG. 2 is a view for describing a method of using the deposition mask device illustrated in FIG. 1. FIG. 3 is a plan view illustrating the deposition mask from a first surface side.

A deposition mask device 10 illustrated in FIGS. 1 and 2 includes a plurality of deposition masks 20 having a substantially rectangular shape in a plan view and a frame 15 attached to circumferential edge portions of the plurality of deposition masks 20. Each of the deposition masks 20 is provided with a plurality of through-holes 25 penetrating the deposition mask 20. As illustrated in FIG. 2, the deposition mask device 10 is supported inside a deposition device 90 such that the deposition mask 20 opposes a lower surface of a substrate serving as a deposition target, for example, an organic EL substrate (deposition target substrate) 92, and is used for deposition of a deposition material on the organic EL substrate 92.

The deposition mask 20 and the organic EL substrate 92 are brought into close contact with each other inside the deposition device 90 by a magnetic force from a magnet (not illustrated). Inside the deposition device 90, a crucible 94 accommodating the deposition material (for example, an organic luminescent material) 98 and a heater 96 heating the crucible 94 are arranged below the deposition mask device 10. After decompressing the interior of the deposition device 90 to high vacuum, the deposition material 98 inside the crucible 94 is vaporized or sublimated by heating using the heater 96 to adhere to the surface of the organic EL substrate 92. As described above, a large number of the through-holes 25 are formed in the deposition mask 20, and the deposition material 98 passes through the through-hole 25 to adhere to the organic EL substrate 92 when depositing the deposition material 98 on the organic EL substrate 92. As a result, the deposition material 98 is deposited on the surface of the organic EL substrate 92 in a desired pattern corresponding to positions of the through-holes 25 of the deposition mask 20. In FIG. 2, a surface (hereinafter also referred to as a first surface) that opposes the organic EL substrate 92 during the deposition step among surfaces of the deposition mask 20 is represented by a reference sign 20a. In addition, a surface (hereinafter also referred to as a second surface) positioned on the opposite side of the first surface 20a among the surfaces of the deposition mask 20 is represented by a reference sign 20b. A deposition source (here, the crucible 94) of the deposition material 98 is arranged on the second surface 20b side.

As described above, the through-holes 25 are arranged in each effective region 22 in a predetermined pattern in the present embodiment. Incidentally, when it is desired to perform color display using a plurality of colors, deposition machines each having the deposition mask 20 corresponding to each color are produced, and the organic EL substrate 92 is sequentially introduced into the respective deposition machines. As a result, for example, an organic luminescent material for red, an organic luminescent material for green, and an organic luminescent material for blue can be sequentially deposited on the organic EL substrate 92.

Incidentally, the frame 15 of the deposition mask device 10 is attached to the circumferential edge portion of the rectangular deposition mask 20. The frame 15 holds the deposition mask 20 in a taut state in order to prevent the deposition mask 20 from warping. The deposition mask 20 and the frame 15 are fixed to each other, for example, by spot welding.

Meanwhile, there is a case where the deposition process is performed inside the deposition device 90 which becomes high-temperature atmosphere. In this case, the deposition mask 20, the frame 15, and the organic EL substrate 92 held inside the deposition device 90 are also heated during the deposition process. At this time, each of the deposition mask 20, the frame 15, and the organic EL substrate 92 shows behavior of a dimensional change based on each thermal expansion coefficient. In this case, if thermal expansion coefficients of the deposition mask 20, the frame 15, and the organic EL substrate 92 are greatly different from each other, misalignment due to a difference in dimensional changes among them is generated, and as a result, dimensional accuracy and positional accuracy of the deposition material adhering onto the organic EL substrate 92 are lowered. In order to solve such a problem, it is preferable that thermal expansion coefficients of the deposition mask 20 and the frame 15 is the same value as thermal expansion coefficient of the organic EL substrate 92. For example, when a glass substrate is used as the organic EL substrate 92, an iron alloy containing nickel can be used as a main material of the deposition mask 20 and the frame 15. Specifically, it is possible to use an iron alloy such as an invar material containing 34 to 38% by mass of nickel and a super invar material containing cobalt in addition to nickel as a material of a metal layer 28 including a first portion 32 and a second portion 37 or a metal plate 21, which will be described later, to form the deposition mask 20. Incidentally, a numerical range expressed by the term "to" includes numerical values placed before and after the term "to" in the present specification. For example, a numerical range defined by the expression "34 to 38% by mass" is identical to a numerical range defined by an expression "34% by mass or higher and 38% by mass or lower".

Incidentally, when temperature of the deposition mask 20, the frame 15, and the organic EL substrate 92 does not reach high temperature during the deposition process, it is not particularly necessary to set thermal expansion coefficients of the deposition mask and the frame 15 to the same value as thermal expansion coefficient of the organic EL substrate 92. In this case, it is possible to use various materials other than the above-described iron alloy, such as nickel and a nickel-cobalt alloy, as the material of the metal layer 28 including the first portion 32 and the second portion 37 or the metal plate 21, which will be described later, to form the deposition mask 20.

(Deposition Mask)

Next, the deposition mask 20 will be described in detail with reference to FIGS. 3 to 4. As illustrated in FIG. 1, in the present embodiment, the deposition mask 20 has a substantially quadrangular shape in a plan view, more accurately, a substantially rectangular outline in a plan view. The deposition mask 20 includes the effective region 22 in which through-holes 25 are formed in a regular array and a surrounding region 23 surrounding the effective region 22. The surrounding region 23 is a region configured to support the effective region 22 and is not a region through which the deposition material, which has been intended to be deposited on the organic EL substrate 92, passes. For example, in the deposition mask 20 used for deposition of the organic luminescent material for the organic EL display device, the effective region 22 is a region inside the deposition mask 20 that opposes an area which forms a display region of the organic EL substrate 92 on which the organic luminescent material is deposited to form pixels. However, a through-hole or a recess for various purposes may be formed in the surrounding region 23. In the example illustrated in FIG. 1, each of the effective regions 22 has a substantially quadrangular shape in a plan view, more accurately, a substantially rectangular outline in a plan view. Although not illustrated, each of the effective regions 22 can have outlines of various shapes in accordance with a shape of the display region of the organic EL substrate 92. For example, each of the effective regions 22 may have a circular outline.

In the illustrated example, the plurality of effective regions 22 of the deposition mask 20 are arranged in a row along one direction parallel to the longitudinal direction of the deposition mask 20 with a predetermined interval therebetween. In the illustrated example, the single effective region 22 corresponds to the single organic EL display device. That is, multifaceted deposition is possible according to the deposition mask device 10 (deposition mask 20) illustrated in FIG. 1.

The deposition mask 20 according to the present embodiment includes a mask body and the plurality of through-holes 25 provided in the mask body. Here, the mask body is used as a concept that means a metallic member in a state where a through-hole 25 is not formed therein, the member formed in a plate shape, and is a concept that corresponds to the metal layer 28 in a case where the deposition mask has a single-layer structure produced by a plating process to be described later, corresponds to a metal layer assembly 28' in a case where the deposition mask has a two-layer structure produced by a plating process to be described later, and corresponds to the metal plate 21 in a case where the deposition mask is produced by an etching process to be described later. As illustrated in FIG. 3, the plurality of through-holes 25 formed in each of the effective regions 22 are arrayed at predetermined pitches along the two directions orthogonal to each other in the effective region 22 in the illustrated example. A shape of the through-hole 25 and the like will be described in detail below. Here, the shape of the through-hole 25 and the like when the deposition mask 20 is formed by the plating process or etching will be described.

[Mode 1: Deposition Mask Having Single-Layer Structure Produced by Plating Process]

First, the case where the deposition mask 20 has the single-layer structure produced by the plating process will be described. FIG. 4 is a cross-sectional view illustrating a case where the deposition mask 20 having the single-layer structure produced by the plating process is cut along a line A-A in FIG. 3.

Figure 4:
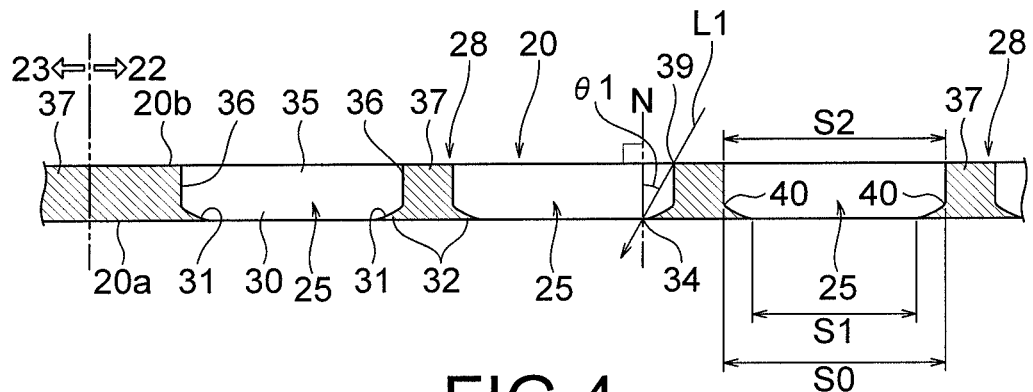
FIG. 4 is a cross-sectional view taken along a line A-A in FIG. 3 in a mode 1

As illustrated in FIGS. 3 and 4, the deposition mask 20 in this mode includes the metal layer 28 (mask body) and the above-described plurality of through-holes 25 provided in the metal layer 28.

Among them, when an indentation elastic modulus is x (GPa) and a 0.2% yield strength is y (MPa), the metal layer 28 satisfies $$y \geq 950 \text{ and } y \geq 24x - 1280 \tag{1}$$

Here, the indentation elastic modulus is a modulus of elasticity calculated by the nano-indentation test for evaluating a modulus of elasticity in a nano-region. As the indentation elastic modulus is adopted as an index of the modulus of elasticity, it is possible to appropriately evaluate the modulus of elasticity even if the thickness of the metal layer 28 is small. The 0.2% yield strength refers to stress at which a permanent strain at unloading becomes 0.2%.

Alternatively, when the indentation elastic modulus is x (GPa) and an indentation hardness is z (GPa), the metal layer 28 satisfies $$z \geq 3.7 \text{ and } z \geq 0.1x - 6.0 \tag{1}$$

Here, the indentation hardness is a hardness calculated by the above-described nano-indentation test. As the indentation hardness is adopted as an index of the hardness, it is possible to appropriately evaluate the hardness even if the thickness of the metal layer 28 is small.

Here, in the present specification, the expression "the metal layer 28 satisfies the above Formula (1)" means that the metal layer 28 in the state where the through-hole 25 is not formed therein satisfies the above Formula (1), and does not mean that the metal layer 28 in a state where the through-hole 25 is formed therein satisfies the above Formula (1). Therefore, in the present specification, it can be said that the deposition mask 20 has a configuration in which the through-hole 25 is formed in the metal layer 28 satisfying the above Formula (1). It is considered that the indentation elastic modulus and the 0.2% yield strength (or the indentation hardness) of the metal layer 28 in the state where the through-hole 25 is formed therein are affected by the size, pitch, shape, and the like of the through-hole 25. Thus, in the state where the plurality of through-holes 25 are formed in the metal layer 28 as a completed form of the deposition mask 20, a region of the metal layer 28 satisfying the above Formula (1) is a region where the through-hole 25 is not formed, more specifically, a region where the influence of the through-hole 25 does not reach the indentation elastic modulus and the 0.2% yield strength (or the indentation hardness), and for example, is a region of the above-described surrounding region 23 where the influence of the through-hole 25 does not reach and a region between the through-holes 25 adjacent to each other in the effective region 22 where the influence of the through-hole 25 does not reach. Therefore, it is preferred to cut off a region of the surrounding region 23 where the through-hole 25 is not included and perform the nano-indentation test to be described later in the case of investigating the indentation elastic modulus and the 0.2% yield strength (or the indentation hardness) of the metal layer 28 using the completed form of the deposition mask 20, and to perform a tensile test in the case of investigating the 0.2% yield strength. In addition, the region between the through-holes 25 may be cut off even in the effective region 22 as long as a distance between the through-holes 25 adjacent to each other is a distance of a degree at which it is possible to perform the nano-indentation test and the tensile test in the case of investigating the 0.2% yield strength. Incidentally, in general, the composition and quality of the material of the metal layer 28 of the deposition mask 20 do not differ depending on a position in terms of material characteristics. Thus, the material characteristics do not differ between a position close to the through-hole 25 and a position far from the through-hole 25.

The through-hole 25 of the deposition mask 20 includes a first opening 30 positioned on the first surface 20a side and having an opening dimension S1 on the first surface 20a and a second opening 35 positioned on the second surface 20b side and having an opening dimension S2 on the second surface 20b. In other words, the first opening 30 on the first surface 20a side and the second opening 35 on the second surface 20b side communicate with each other to form the through-hole 25. In FIG. 4, in the effective region 22 of the deposition mask 20, a portion defining an outline of the first opening 30 on the first surface 20a side (hereinafter also referred to as the first portion) is represented by a reference sign 32, and a portion defining an outline of the second opening 35 on the second surface 20b side (hereinafter also referred to as the second portion) is represented by a reference sign 37. For example, the first portion 32 and the second portion 37 are simultaneously formed as the metal layer 28 precipitated on a front surface 51a of a base material 51 in the plating process to be described later.

As illustrated in FIG. 3, the first opening 30 and the second opening 35 forming the through-hole 25 may have a substantially polygonal shape in a plan view. Here, an example in which the first opening 30 and the second opening 35 are formed in a substantially quadrangular shape, more specifically, a substantially square shape is illustrated. Although not illustrated, the first opening 30 and the second opening 35 may have other substantially polygonal shapes such as a substantially hexagonal shape and a substantially octagonal shape. Incidentally, the "substantially polygonal shape" is a concept including a shape in which corners of a polygon are rounded. Although not illustrated, the first opening 30 and the second opening 35 may have a circular shape. In addition, a shape of the first opening 30 and a shape of the second opening 35 are not necessarily formed in similar shapes as long as the second opening 35 has the outline that surrounds the first opening 30 in a plan view.

Figure 5:
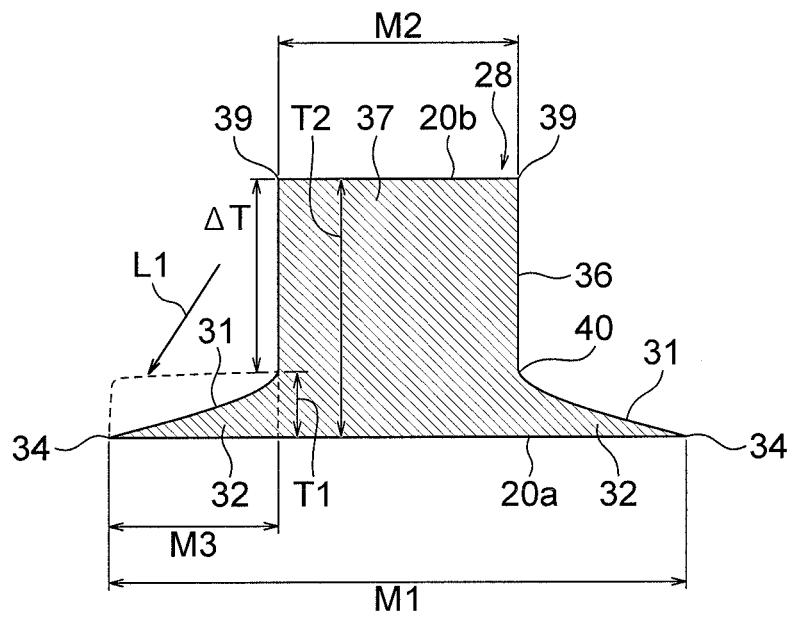
FIG. 5 is a cross-sectional view illustrating each part of a first portion and a second portion of the deposition mask illustrated in FIG. 4 in an enlarged manner.

FIG. 5 is a view of the first portion 32 and the second portion 37 of the metal layer 28 of FIG. 4 in an enlarged manner. As will be described later, the first portion 32 is a portion formed by metal precipitated between a low-adhesion region 56 of the base material 51 and a first surface 61 of a plating resist pattern 60. On the other hand, the second portion 37 is a portion formed by metal precipitated in a gap 64 of the plating resist pattern 60. In FIG. 5, a virtual boundary line between the first portion 32 and the second portion 37 is indicated by a one-dot chain line. In addition, a connecting portion where a wall surface 31 of the first opening 30 defined by the first portion 32 and a wall surface 36 of the second opening 35 defined by the second portion 37 are in contact with each other is represented by a reference sign 40. Incidentally, the "wall surface 31" is a surface that defines the first opening 30 among surfaces of the first portion 32. Similarly, the above-described "wall surface 36" is a surface defining the second opening 35 among surfaces of the second portion 37.

As illustrated in FIG. 5, a width M2 of the metal layer 28 on the second surface 20b of the deposition mask 20 is smaller than a width M1 of the metal layer 28 on the first surface 20a of the deposition mask 20. In other words, the opening dimension S2 of the through-hole 25 (the second opening 35) on the second surface 20b is larger than the opening dimension S1 of the through-hole 25 (the first opening 30) on the first surface 20a. Hereinafter, advantages obtained by configuring the metal layer 28 in this manner will be described.

The deposition material 98 flying from the second surface 20b side of the deposition mask 20 sequentially passes through the second opening 35 and the first opening 30 of the through-hole 25 and adheres to the organic EL substrate 92. A region of the organic EL substrate 92 to which the deposition material 98 adheres is mainly determined by the opening dimension S1 and an opening shape of the through-hole 25 on the first surface 20a. Meanwhile, the deposition material 98 not only moves along a normal direction N of the deposition mask 20 from the crucible 94 toward the organic EL substrate 92 but also moves in a direction which is greatly inclined with respect to the normal direction N of the deposition mask 20 as illustrated by an arrow L1 directed from the second surface 20b side to the first surface 20a in FIG. 4. Here, if the opening dimension S2 of the through-hole 25 on the second surface 20b is the same as the opening dimension S1 of the through-hole 25 on the first surface 20a, most of the deposition material 98 moving in the direction that is greatly inclined with respect to the normal direction N of the deposition mask 20 reaches and adheres to the wall surface 36 of the second opening 35 of the through-hole 25 before passing through the through-hole 25 and reaching the organic EL substrate 92. Therefore, it can be said that it is preferable to increase the opening dimension S2 of the second opening 35, that is, to reduce the width M2 of the metal layer 28 on the second surface 20b side in order to enhance the utilization efficiency of the deposition material 98.

In FIG. 4, an angle formed by a straight line L1 passing through an end 39 of the second portion 37 and an end 34 of the first portion 32 with respect to the normal direction N of the deposition mask 20 is represented by a reference sign 81. It is advantageous to increase the angle θ1 in order to allow the deposition material 98 moving obliquely to reach the organic EL substrate 92 as much as possible without reaching the wall surface 36 of the second opening 35. Upon increasing the angle θ1, it is advantageous to set the width M2 of the metal layer 28 on the second surface 20b side to be smaller than the width M1 of the metal layer 28 on the first surface 20a side. As apparent from the drawing, it is advantageous to reduce a thickness T1 of the first portion 32 and a thickness T2 of the second portion 37 upon increasing the angle θ1. Here, the "thickness T1 of the first portion 32" means a thickness of the first portion 32 at a boundary between the first portion 32 and the second portion 37. As apparent from FIG. 5, the thickness T2 of the second portion 37 is synonymous with a thickness of the metal layer 28 forming the effective region 22 of the deposition mask 20. Incidentally, it is considered that the strength of the deposition mask 20 decreases when the width M2, the thickness T1, and the thickness T2 are excessively reduced, and thus, the deposition mask 20 is damaged during conveyance or use. For example, it is considered that the deposition mask 20 is damaged by tensile stress applied to the deposition mask 20 when the deposition mask 20 is taut to be installed to the frame 15. When considering these points, it can be said that it is preferable to set a width and a thickness of each portion of the deposition mask 20 within the following ranges. As a result, the above-described angle θ1 can be set to, for example, 45° or larger.

The width M1 of the metal layer 28 on the first surface 20a side: 5 to 25 μm

The width M2 of the metal layer 28 on the second surface 20b side: 2 to 20 μm

The thickness T1 of the first portion 32: 5 μm or less

The thickness T2 of the second portion 37: 1 to 50 μm, more preferably 3 to 30 μm, still more preferably 3 to 25 μm, and still more preferably 3 to 15 μm A difference ΔT between the thickness T1 and the thickness T2: 0.1 to 50 μm, more preferably 3 to 30 μm, still more preferably 3 to 25 μm, and still more preferably 3 to 15 μm In particular, as the thickness T2 of the second portion 37 is set to 15 μm or less, it is possible to produce the deposition mask 20 with a thickness that is difficult to obtain with the deposition mask 20 made of a rolled material to be described later. In this case, it is possible to obtain the deposition mask 20 capable of reducing the influence of shadow and improving the utilization efficiency of the deposition material.

Table 1 shows examples of the number of display pixels and values of a width and a thickness of each portion of the deposition mask 20, which are obtained depending on the number of display pixels, in a 5-inch organic EL display device. Incidentally, the term "FHD" means Full High Definition, the term "WQHD" means Wide Quad High Definition, and the term "UHD" means Ultra High Definition.

TABLE 1

| Number of display pixels | M1 | M2 | T1 | T2 | ΔT |
|---|---|---|---|---|---|
| FHD | 30 μm or less | 25 μm or less | 5 μm or less | 3 to 30 μm | 1 to 25 μm |
| WQHD | 25 μm or less | 20 μm or less | 4 μm or less | 3 to 25 μm | 1 to 21 μm |
| UHD | 15 μm or less | 10 μm or less | 3 μm or less | 3 to 15 μm | 0.1 to 15 μm |

Next, the shape of the first portion 32 will be described in more detail. When the first portion 32 at the end 34 has a shape largely steepened toward the second surface 20b as provisionally illustrated by a dotted line in FIG. 5, it is considered that most of the deposition material 98 after having passed through the second opening 35 of the through-hole 25 reaches and adheres to the wall surface 31 of the first portion 32. In order to suppress such adhesion of the deposition material 98 to the first portion 32 in the vicinity of the end 34, it is preferable that the first portion 32 have a thickness smaller than the thickness T1 of a part of the first portion 32 in contact with the second portion 37 at the end 34 and in the vicinity of the end 34 as illustrated in FIG. 5. For example, as illustrated in FIG. 5, it is preferable that the thickness of the first portion 32 monotonously decrease from the part of the first portion 32 in contact with the second portion 37 toward the end 34. Such a shape of the first portion 32 can be realized by forming the first portion 32 by the plating process as will be described later.

(Method of Manufacturing Deposition Mask)

Next, the method of manufacturing the deposition mask 20 having the above-described configuration will be described with reference to FIGS. 6 to 13B.

First, a step (film formation step) of forming the metal layer 28 (mask body) provided with the through-holes 25 on the base material 51 to be described later by the plating process is performed. The film formation step includes a preparation step, a surface treatment resist formation step, a surface treatment step, a plating resist formation step, and a plating process step, which will be described later.

(Preparation Step)

Figure 6:
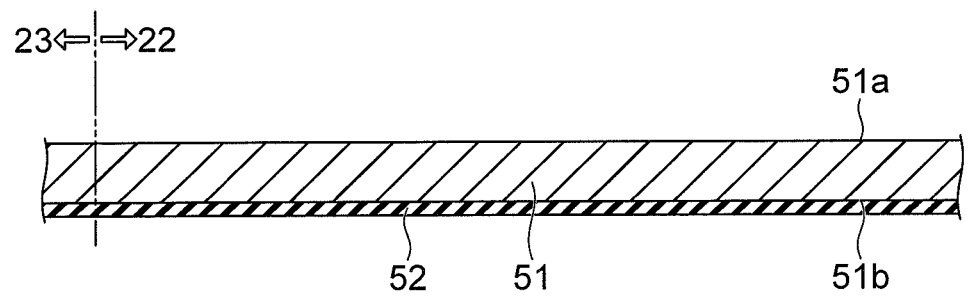
FIG. 6 is a cross-sectional view illustrating a base material having a front surface and a back surface.

First, the preparation step of preparing the base material 51, which serves as a base during the plating process, is performed as illustrated in FIG. 6. Here, an example in which the plating process is an electrolytic plating process will be described. In this case, at least a portion of the front surface 51a of the base material 51 on which the metal layer 28 is precipitated is formed of a conductive layer having conductivity. For example, the entire base material 51 may be formed of the conductive layer having conductivity. In this case, a cover film 52 having an insulating property, configured to prevent a back surface 51b from being conducted to another member, may be provided on the back surface 51b positioned on the opposite side of the front surface 51a of the base material 51.

A material forming the conductive layer of the base material 51 is not particularly limited as long as predetermined metal can be precipitated during the plating process to be described later. For example, a material having conductivity, such as a metal material and an oxide conductive material, is appropriately used as the material forming the conductive layer of the base material 51. Examples of the metal material can include stainless steel, copper, and the like. Preferably, a material having high adhesion with respect to a plating resist pattern 60, which will be described later, is used as the material forming the conductive layer of the base material 51. For example, when the plating resist pattern 60 is produced by patterning what is called a dry film, such as a resist film containing an acrylic photocurable resin, it is preferable to use copper having high adhesion with respect to the dry film as the material forming the conductive layer of the base material 51.

Figure 9A:
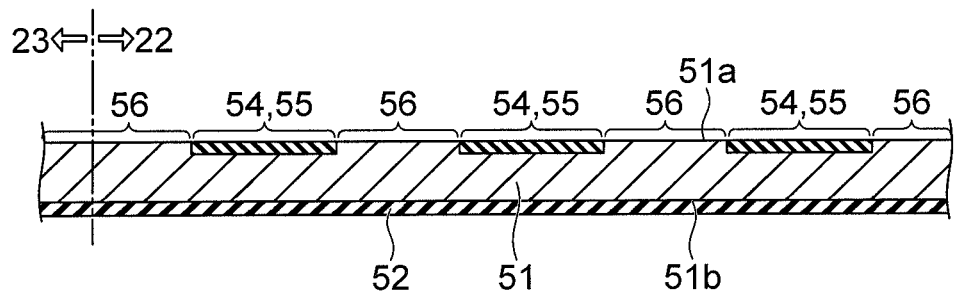
FIG. 9A is a cross-sectional view illustrating the base material on which a high-adhesion region formed of a region to be treated is formed.
Figure 9B:
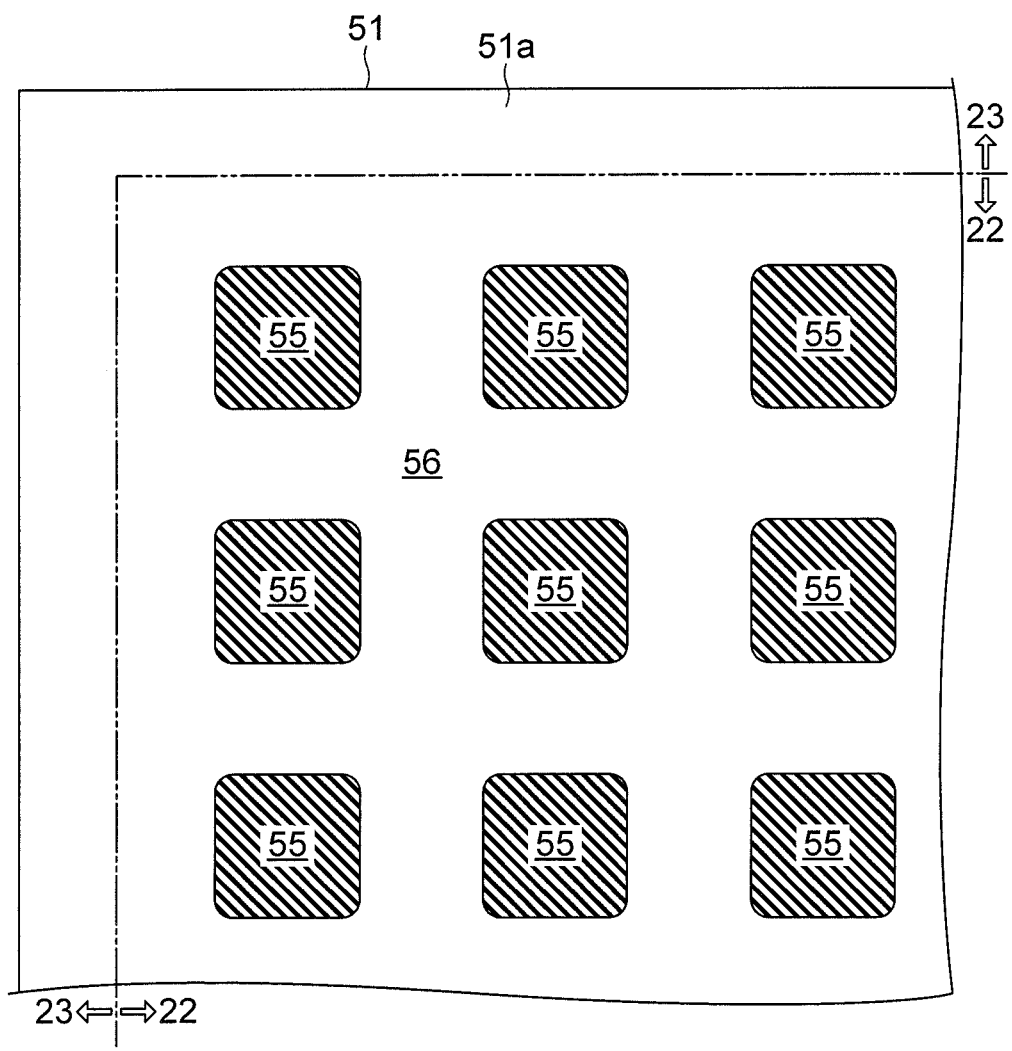
FIG. 9B is a plan view illustrating the base material on which the high-adhesion region composed of the region to be treated is formed.

In the preparation step, a step of forming a high-adhesion region 55 and the low-adhesion region 56 on the front surface 51a of the base material 51 is performed after preparing the base material 51. Here, the "high-adhesion region 55 and low-adhesion region 56" are defined as regions configured such that an adhesion force of the first surface 61 of the plating resist pattern 60 with respect to the high-adhesion region 55, which will be described later, is relatively higher than an adhesion force of the first surface 61 of the plating resist pattern 60 with respect to the low-adhesion region 56. FIGS. 9A and 9B are a cross-sectional view and a plan view illustrating the base material 51 on which the high-adhesion region 55 and the low-adhesion region 56 are formed. The high-adhesion region 55 is a region corresponding to the first opening 30 on the first surface 20a side of the deposition mask 20 that is produced on the front surface 51a of the base material 51 by the plating process. As illustrated in FIGS. 9A and 9B, the plurality of high-adhesion regions 55 are formed on the front surface 51a of the base material 51. In addition, each of the high-adhesion regions 55 has a shape corresponding to the first opening 30, for example, a substantially rectangular shape. On the other hand, the low-adhesion region 56 is formed so as to surround each of the high-adhesion regions 55. For example, a cross-cut test described in JIS K5400-8, a cross-cut method described in JIS 5600-5-6, a pull off method described in JIS K5600-5-7, and the like can be used as a method of evaluating the adhesion forces of the high-adhesion region 55 and the low-adhesion region 56 with respect to the plating resist pattern 60.

(Surface Treatment Resist Formation Step)

Figure 7:
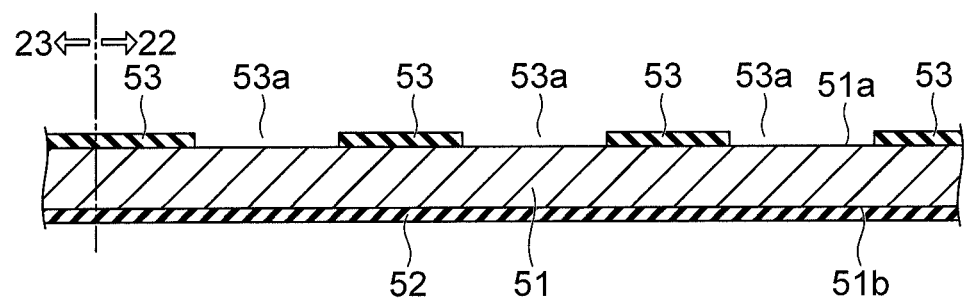
FIG. 7 is a cross-sectional view illustrating a surface treatment resist formation step of forming a surface treatment resist pattern on the front surface of the base material.

Hereinafter, an example of a method for forming the high-adhesion region 55 and the low-adhesion region 56 on the base material 51 will be described with reference to FIGS. 7 and 8. First, the surface treatment resist formation step of forming a surface treatment resist pattern 53 on a region corresponding to the low-adhesion region 56 on the front surface 51a of the base material 51 is performed as illustrated in FIG. 7. In other words, a surface treatment resist pattern 53 is provided on the front surface 51a of the base material 51 such that a gap 53a is formed in a region corresponding to the high-adhesion region 55 on the front surface 51a of the base material 51. Specifically, first, a negative-type resist film is formed by pasting a dry film on the front surface 51a of the base material 51. Examples of the dry film can include a film containing an acrylic photocurable resin such as RY3310 manufactured by Hitachi Chemical Co., Ltd. Next, an exposure mask configured to prevent light from passing through a region that needs to be the gap 53a out of the resist film is prepared, and the exposure mask is arranged on the resist film. Thereafter, the exposure mask is sufficiently brought into close contact with the resist film by vacuum adhesion. Incidentally, a positive-type resist film may be used. In this case, an exposure mask configured to allow light to pass through a region that is desirably removed out of the resist film is used as the exposure mask.

Thereafter, the resist film is exposed to light through the exposure mask. Further, the resist film is developed to form an image on the exposed resist film. In the above-described manner, the surface treatment resist pattern 53 illustrated in FIG. 7 can be formed. Incidentally, a heat treatment step of heating the surface treatment resist pattern 53 after the development step may be performed in order to more strongly cause the surface treatment resist pattern 53 to be brought into close contact with the front surface 51a of the base material 51.

(Surface Treatment Step)

Figure 8:
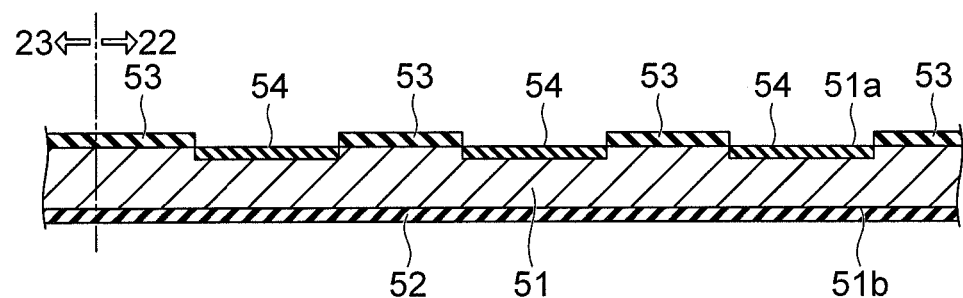
FIG. 8 is a cross-sectional view illustrating a surface treatment step of supplying a surface treatment solution onto the front surface of the base material.

Next, the surface treatment step of subjecting a region of the front surface 51a of the base material 51 that is not covered with the surface treatment resist pattern 53 to surface treatment to form a treated region 54 is performed as illustrated in FIG. 8. Here, a solution capable of roughening the front surface 51a by soft etching of the front surface 51a of the base material 51 is used as a surface treatment solution. For example, a so-called hydrogen peroxide/sulfuric acid-based soft etching agent containing a hydrogen peroxide solution and sulfuric acid or the like is used as the surface treatment solution, and specifically, a bond film manufactured by Atoteck Co., Ltd., or the like can be used as the surface treatment solution. As the front surface 51a of the base material 51 is partially roughened using such a surface treatment solution, it is possible to partially enhance an adhesion force of the treated region 54 of the front surface 51a with respect to the plating resist pattern 60 to be described later. That is, the treated region 54 that has been subjected to the surface treatment using the surface treatment solution becomes the high-adhesion region 55 having a high adhesion force with respect to the plating resist pattern 60. In addition, a region that is covered with the surface treatment resist pattern 53 and thus has not been subjected to the surface treatment becomes the low-adhesion region 56 whose adhesion force with respect to the plating resist pattern 60 is relatively lower than that of the high-adhesion region 55. A degree of roughening treatment applied to the high-adhesion region 55, for example, a surface roughness of the high-adhesion region 55 is appropriately determined depending on a material forming the high-adhesion region 55 and a material forming the plating resist pattern 60 to be described later. For example, when the surface roughness is measured using a scanning white light interferometer VertScan manufactured by Ryoka Systems Inc., each surface roughness in the high-adhesion region 55 and the low-adhesion region 56 is within the following ranges.

TABLE 2

| | Arithmetic average roughness (Ra) | Maximum height (Ry) | Surface area ratio (s-ratio) |
| --- | --- | --- | --- |
| high-adhesion region | 0.2 to 0.7 μm | 2.0 to 5.0 μm | 1.6 to 2.6 |
| Low-adhesion region | 0.2 μm or less | 2.0 μm or less | 1.1 or less |

Incidentally, in Table 2, the "surface area ratio (s-ratio)" means a ratio of a three-dimensional actually-measured area of the surface including undulations and irregularities of the surfaces of the high-adhesion region 55 or the low-adhesion region 56 relative to a two-dimensional projection area of the surface obtained without consideration of the undulations and irregularities of the surface of the high-adhesion region 55 or the low-adhesion region 56.

Incidentally, the content of the surface treatment step is not limited to the above-described roughening treatment as long as the adhesion force of the front surface 51a of the base material 51 with respect to the plating resist pattern 60 can be partially enhanced. For example, the surface treatment step may be a step of providing a layer having a high adhesion with respect to the plating resist pattern 60 in the region of the front surface 51a of the base material 51 that is not covered with the surface treatment resist pattern 53.

Thereafter, a removal step of removing the surface treatment resist pattern 53 is performed. For example, the surface treatment resist pattern 53 can be peed off from the front surface 51a of the base material 51 by using an alkali-based peeling solution. In this manner, it is possible to prepare the base material 51 having the front surface 51a partitioned into the plurality of high-adhesion regions 55 and the low-adhesion region 56 surrounding the high-adhesion regions 55 as illustrated in FIGS. 9A and 9B.

(Plating Resist Formation Step)

Figure 10A:
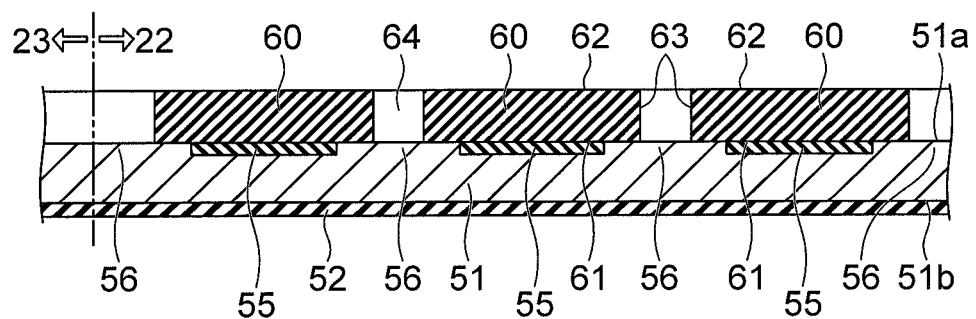
FIG. 10A is a cross-sectional view illustrating a plating resist formation step of forming a plating resist pattern on the front surface of the base material.
Figure 10B:
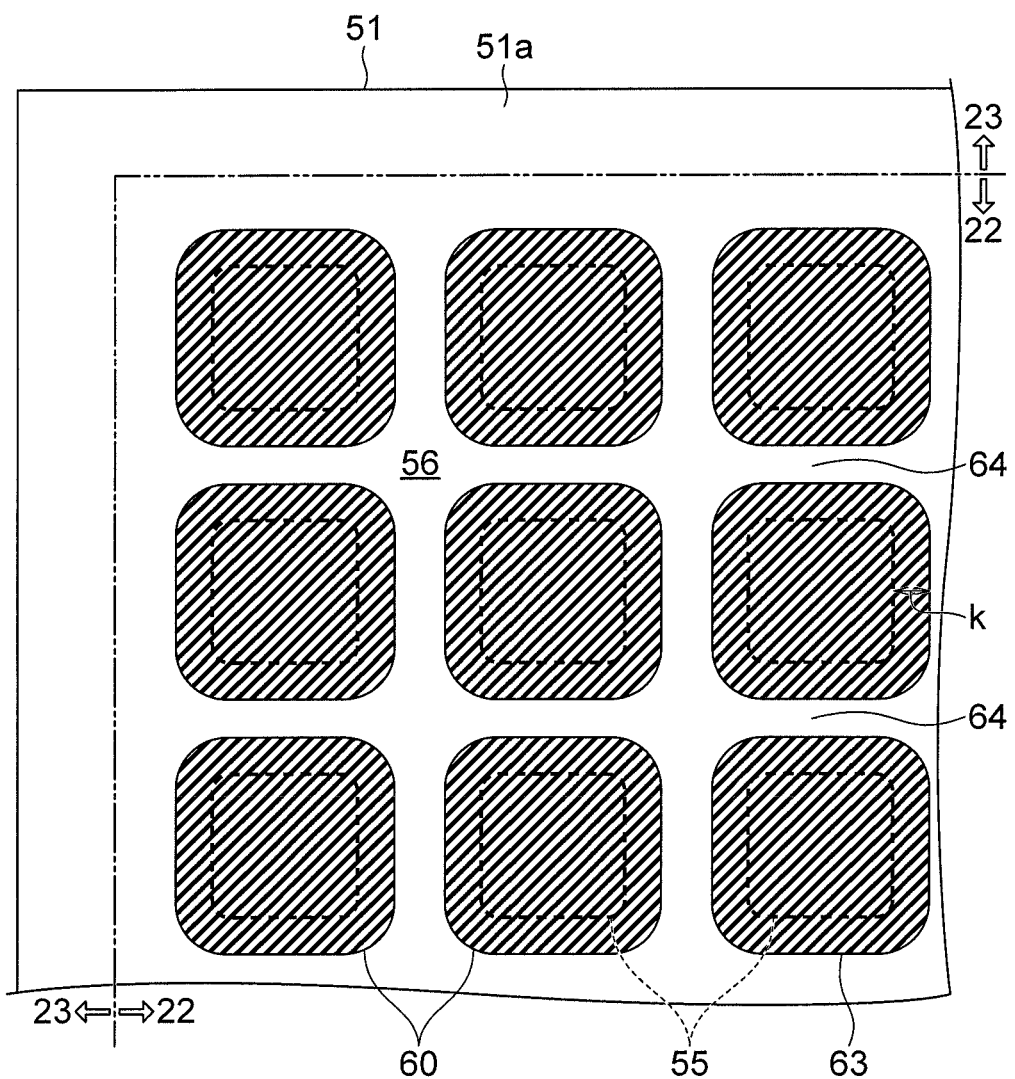
FIG. 10B is a plan view illustrating the plating resist pattern of FIG. 10A.

Next, the plating resist formation step of forming the plating resist pattern 60 on the front surface 51a of the base material 51 with the predetermined gap 64 therebetween is performed. FIGS. 10A and 10B are a cross-sectional view and a plan view illustrating the base material 51 on which the plating resist pattern 60 is formed. As illustrated in FIG. 10A, the plating resist pattern 60 includes the first surface 61 opposing the front surface 51a of the base material 51 and the second surface 62 positioned on the opposite side of the first surface 61, and a side surface 63 facing the gap 64.

As illustrated in FIGS. 10A and 10B, the plating resist formation step is performed such that the first surface 61 of the plating resist pattern 60 covers the high-adhesion region 55 and spreads to the low-adhesion region 56 and the gap 64 of the plating resist pattern 60 is positioned on the low-adhesion region 56. In this case, the first surface 61 of the plating resist pattern 60 is in contact with both the high-adhesion region 55 and the low-adhesion region 56, and the side surface 63 of the plating resist pattern 60 is in contact with the low-adhesion region 56 as illustrated in FIG. 10A. Incidentally, since the high-adhesion region 55 has been subjected to the roughening treatment as described above, an adhesion force of the plating resist pattern 60 with respect to the high-adhesion region 55 is higher than an adhesion force of the plating resist pattern 60 with respect to the low-adhesion region 56.

As will be described later, the first portion 32 of the deposition mask 20 is formed by a plating solution infiltrating between the low-adhesion region 56 and the plating resist pattern 60. A width k of a portion of the plating resist pattern 60 protruding from the high-adhesion region 55 to the low-adhesion region 56 corresponds to a width M3 of the first portion 32 on the first surface 20a and falls within a range of, for example, 0.5 to 5.0 μm.

In the plating resist formation step, first, a negative-type resist film is formed by pasting a dry film on the front surface 51a of the base material 51 similarly to the case of forming the surface treatment resist described above. Examples of the dry film can include a film containing an acrylic photo-curable resin such as RY3310 manufactured by Hitachi Chemical Co., Ltd. Next, an exposure mask configured to prevent light from passing through a region that needs to be the gap 64 out of the resist film is prepared, and the exposure mask is arranged on the resist film. Thereafter, the exposure mask is sufficiently brought into close contact with the resist film by vacuum adhesion. Incidentally, a positive-type resist film may be used. In this case, an exposure mask configured to allow light to pass through a region that is desirably removed out of the resist film is used as the exposure mask.

Thereafter, the resist film is exposed to light through the exposure mask. Further, the resist film is developed to form an image on the exposed resist film. In the above-described manner, it is possible to form the plating resist pattern 60 illustrated in FIG. 10A and FIG. 10B. Incidentally, a heat treatment step of heating the plating resist pattern 60 after the development step may be performed in order to more strongly cause the plating resist pattern 60 to be brought into close contact with the front surface 51a of the base material 51, particularly to the high-adhesion region 55. In addition, after the development step, an activation step of activating a metal surface of the low-adhesion region 56 surrounded by the plating resist pattern 60 may be performed using an acidic solution or the like. As a result, the adhesion between the plating resist pattern 60 and the low-adhesion region 56 can be further reduced. For example, sulfamic acid can be used as the acidic solution.

(Plating Process Step)

Figure 11:
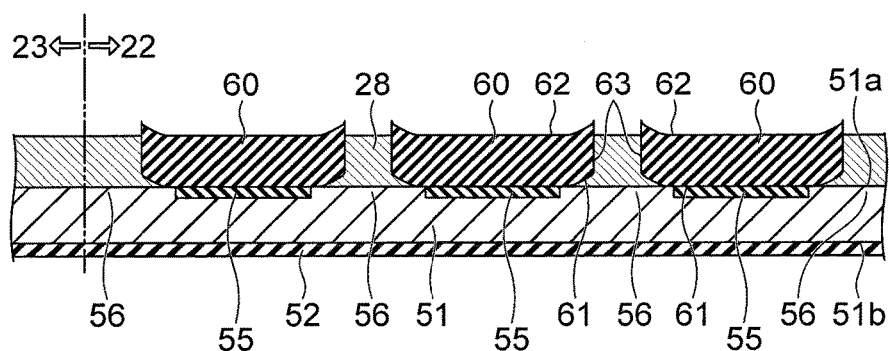
FIG. 11 is a cross-sectional view illustrating a plating process step of precipitating a metal layer having through-holes formed therein on the front surface of the base material.

Next, the plating process step of supplying the plating solution to the gap 64 of the plating resist pattern 60 is performed. For example, the base material 51 provided with the plating resist pattern 60 may be immersed in a plating tank filled with the plating solution. As a result, the metal layer 28 can be precipitated on the front surface 51a of the base material 51 in the gap 64 as illustrated in FIG. 11.

A specific method of the plating process step is not particularly limited as long as the metal layer 28 can be precipitated on the front surface 51a of the base material 51. For example, the plating process step may be performed as a so-called electrolytic plating process step of causing an electric current to flow through the conductive layer of the base material 51 to precipitate the metal layer 28 on the low-adhesion region 56 of the front surface 51a of the base material 51. Alternatively, the plating process step may be an electroless plating process step. Incidentally, when the plating process step is the electroless plating process step, an appropriate catalyst layer is provided on the conductive layer of the base material 51. The catalyst layer may be provided on the conductive layer of the base material 51 even when the electrolytic plating process step is performed.

Components of the plating solution to be used are appropriately determined depending on characteristics required for the metal layer 28. For example, when the metal layer 28 is made of an iron alloy containing nickel, a mixed solution of a solution containing a nickel compound and a solution containing an iron compound can be used as the plating solution. For example, a mixed solution of a solution containing nickel sulfamate or nickel bromide and a solution containing ferrous sulfamate can be used. The plating solution may contain various additives. Examples of the additives may include a pH buffer such as boric acid or an additive such as malonic acid and saccharin. In addition, for example, a plating solution containing nickel and cobalt, a plating solution containing nickel, or the like can be used depending on a material forming the metal layer 28.

Meanwhile, the gap 64 of the plating resist pattern 60 is positioned on the low-adhesion region 56 of the base material 51 as described above. In addition, the plating resist pattern 60 protrudes from the high-adhesion region 55 to the low-adhesion region 56. In this case, the plating solution supplied to the gap 64 of the plating resist pattern 60 can also infiltrate between the low-adhesion region 56 and the first surface 61 of the plating resist pattern 60. Due to such infiltration of the plating solution, the metal (metal layer 28) is precipitated not only in the gap 64 but also between the low-adhesion region 56 of the base material 51 and the first surface 61 of the plating resist pattern 60 as illustrated in FIG. 11. Thus, the metal layer 28 formed on the front surface 51a of the base material 51 by the plating process step includes the first portion 32 formed of the metal precipitated between the low-adhesion region 56 of the base material 51 and the first surface 61 of the plating resist pattern 60 as well as the second portion 37 formed of the metal precipitated in the gap 64 of the plating resist pattern 60. Meanwhile, the adhesion force of the high-adhesion region 55 with respect to the plating resist pattern 60 is enhanced by the roughening treatment. Thus, the infiltration of the plating solution can be prevented by the high-adhesion region 55 as illustrated in FIG. 11. Thus, the above-described first opening 30 can be secured in the metal layer 28.

In this manner, the metal layer 28 illustrated in FIGS. 4 and 5 is obtained.

(Removal Step)

Figure 12:
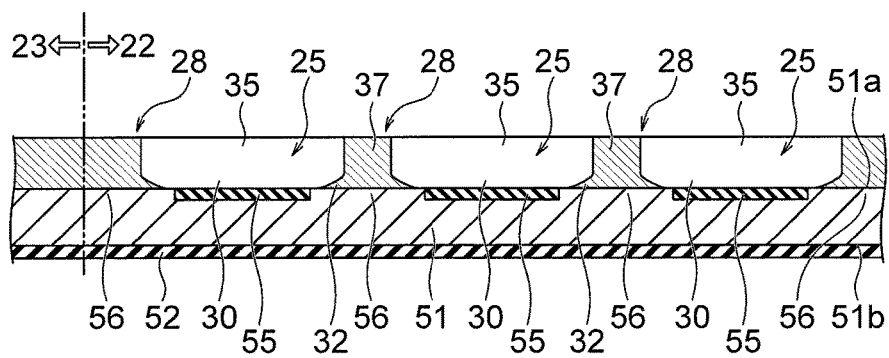
FIG. 12 is a view illustrating a removal step of removing the plating resist pattern.

Thereafter, a removal step of removing the plating resist pattern 60 from the metal layer 28 is performed as illustrated in FIG. 12. For example, the plating resist pattern 60 can be peeled off from the front surface 51a of the base material 51 by using an alkali-based peeling solution. As the plating resist pattern 60 is removed, the through-holes 25 appear, and the metal layer 28 provided with the through-holes 25 can be obtained.

(Separation Step)

Figure 13A:
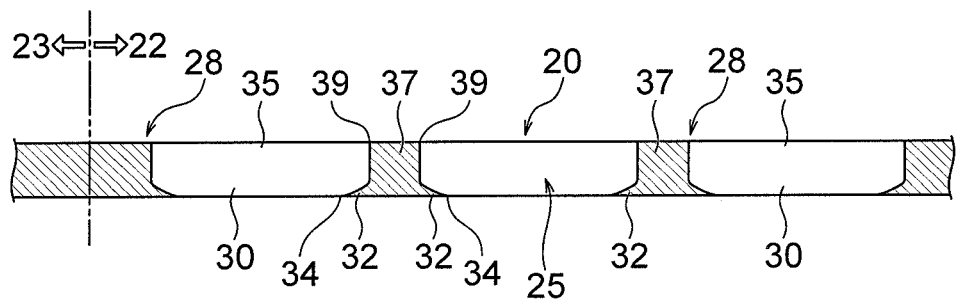
FIG. 13A is a view illustrating a deposition mask obtained by separating the metal layer having the through-holes formed therein from the base material.
Figure 13B:
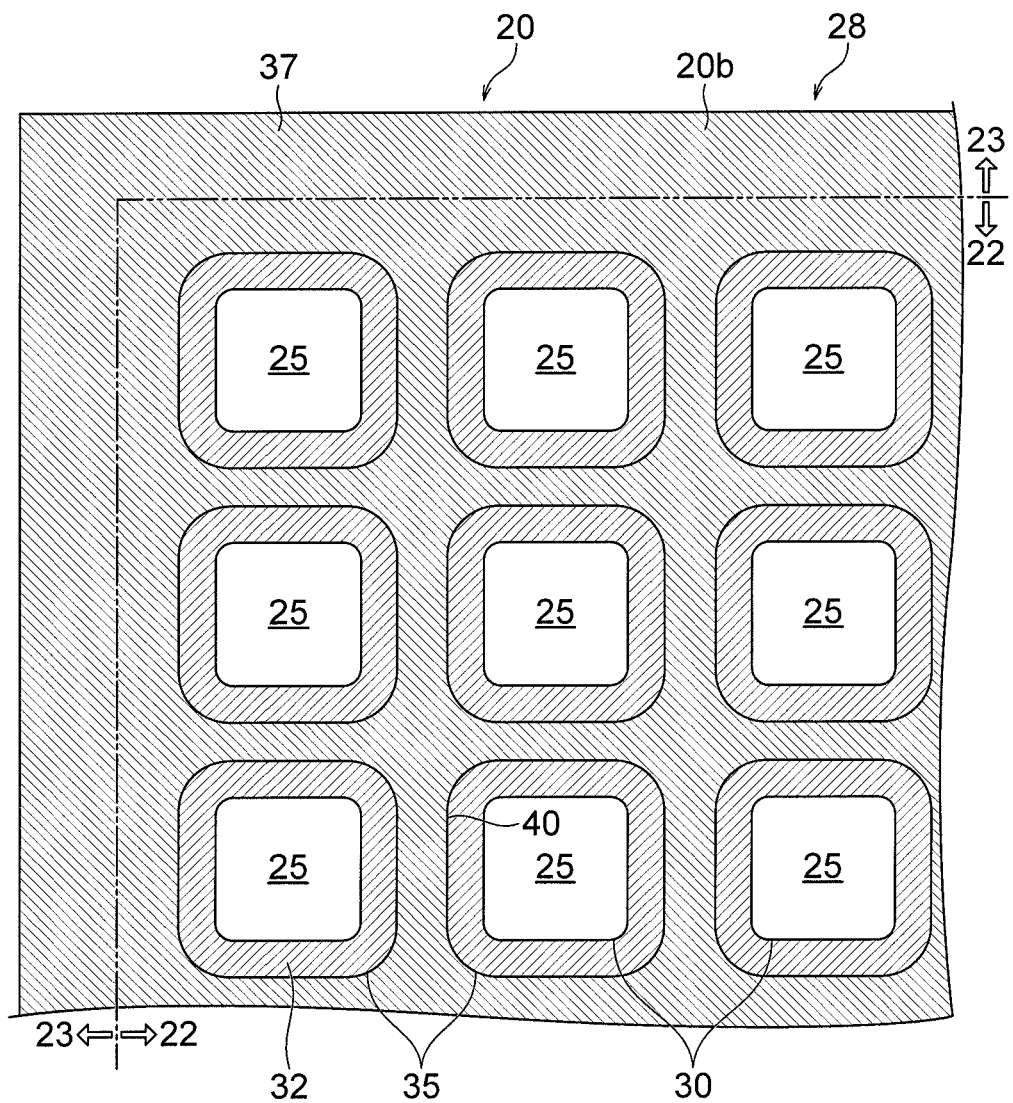
FIG. 13B is a plan view illustrating a case where the deposition mask of FIG. 13A is viewed from a second surface side.

Next, a separation step of separating the metal layer 28 from the front surface 51a of the base material 51 is performed. As a result, it is possible to obtain the deposition mask 20 having the metal layer 28 which includes the second portion 37 extending from the first surface 20a to the second surface 20b and the first portion 32 extending from the second portion 37 toward the center of the through-hole 25 on the first surface 20a side as illustrated in FIG. 13A. FIG. 13B is a plan view illustrating a case where the deposition mask 20 is viewed from the second surface 20b side.

Hereinafter, an example of the separation step will be described in detail. First, a film provided with a substance having stickiness by coating or the like is pasted to the metal layer 28 formed on the base material 51. Next, the film is pulled away from the base material 51 by pulling up or rolling the film, and as a result, the metal layer 28 is separated from the base material 51. Thereafter, the film is peeled off from the metal layer 28.

Incidentally, a substance which loses stickiness by being irradiated with light such as UV or by being heated may be used as the substance having stickiness. In this case, a step of irradiating the film with light or a step of heating the film is performed after separating the metal layer 28 from the base material 51. As a result, it is possible to make the step of peeling off the film from the metal layer 28 easy. For example, the film can be peeled off in a state where the film and the metal layer 28 are kept to be parallel to each other as much as possible. As a result, it is possible to suppress the metal layer 28 from being curved when peeling off the film so that it is possible to prevent the deposition mask 20 from being deformed such as curvature.

According to the above-described Mode 1, the plating resist formation step is performed such that the plating resist pattern 60 covers the high-adhesion region 55 and spreads to the low-adhesion region 56 and the gap 64 of the plating resist pattern 60 is positioned on the low-adhesion region 56 as described above. Thus, the plating solution can infiltrate at least partially between the low-adhesion region 56 and the plating resist pattern 60 during the plating process step. As a result, the metal layer 28 is configured to include the first portion 32 formed by the metal precipitated between the low-adhesion region 56 of the base material 51 and the plating resist pattern 60 and the second portion 37 formed by the metal precipitated in the gap 64 of the plating resist pattern 60. In this case, the shape of the through-hole 25 of the deposition mask 20 is defined by the first portion 32 on the first surface 20a and defined by the second portion 37 on the second surface 20b. Therefore, it is possible to obtain the through-hole 25 having a complicated shape.

In addition, it is possible to obtain the first portion 32 having a small thickness by forming the second portion using the plating solution which has infiltrated between the low-adhesion region 56 and the plating resist pattern 60. Further, it is also possible to monotonously decrease the thickness of the first portion 32 from the portion of the first portion 32 in contact with the second portion 37 toward the end 34. As a result, it is possible to effectively increase the above-described angle θ1 corresponding to a flying angle of the deposition material 98 that can reach the organic EL substrate 92.

In addition, it is possible to set the thickness of the deposition mask 20 at random independently of the shape of the through-hole 25 by forming the metal layer 28 using the plating process. Thus, it is possible to make the deposition mask 20 have sufficient strength. Therefore, it is possible to produce the high-definition organic EL display device and to provide the deposition mask 20 with excellent durability.

[Mode 2: Deposition Mask Having Two-Layer Structure Produced by Plating Process]

Figure 14:
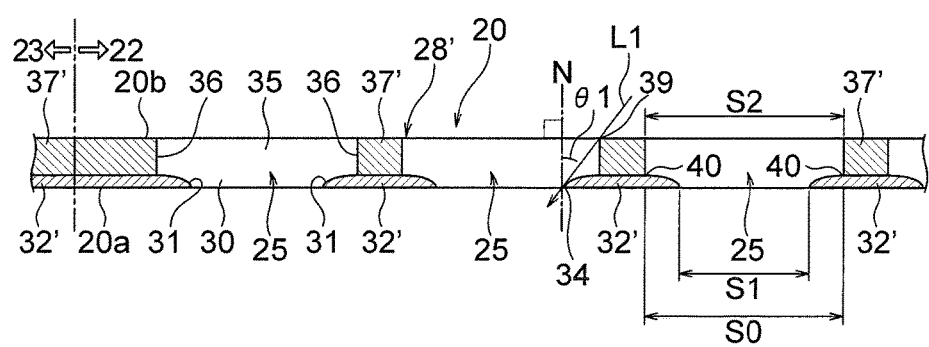
FIG. 14 is a cross-sectional view taken along the line A-A in FIG. 3 in a mode 2.

Next, a case where the deposition mask 20 has the two-layer structure produced by a plating process will be described. FIG. 14 is a cross-sectional view illustrating a case where the deposition mask 20 having the two-layer structure produced by the plating process is cut along the line A-A in FIG. 3.

As illustrated in FIG. 14, the deposition mask 20 in this mode includes a metal layer assembly 28' (mask body) and the above-described plurality of through-holes 25 provided in the metal layer assembly 28'. The metal layer assembly 28' includes a first metal layer 32' provided with first openings 30 in a predetermined pattern and a second metal layer 37' having second openings 35 communicating with the first openings 30. The second metal layer 37' is arranged closer to the second surface 20b side of the deposition mask 20 than the first metal layer 32'. In the example illustrated in FIG. 14, the first metal layer 32' forms the first surface 20a of the deposition mask 20, and the second metal layer 37' forms the second surface 20b of the deposition mask 20.

Among them, the metal layer assembly 28' satisfies the above Formula (1) similarly to the above-described metal layer 28.

Here, in the present specification, the term "metal layer assembly 28'" means a concept of a member (having a simple plate shape) in a state where the through-hole 25 is not formed therein, which is similar to the above-described metal layer 28. That is, in the present specification, conceptually, the deposition mask 20 has the configuration in which the metal layer assembly 28' is provided with the plurality of through-holes 25 as a concept different from the metal layer assembly 28'. As a result, the expression that the metal layer assembly 28' satisfies the above Formula (1) means that the metal layer assembly 28' in the state where the through-hole 25 is not formed therein satisfies the above Formula (1), and does not mean that the metal layer assembly 28' in the state where the through-hole 25 is formed therein satisfies the above Formula (1). It is considered that an indentation elastic modulus and a 0.2% yield strength (or an indentation hardness) of the metal layer assembly 28' in the state where the through-hole 25 is formed therein are affected by the size, pitch, shape, and the like of the through-hole 25. Thus, in the state where the plurality of through-holes 25 are formed in the metal layer assembly 28' as a completed form of the deposition mask 20, a region of the metal layer assembly 28' satisfying the above Formula (1) is a region where the through-hole 25 is not formed, more specifically, a region where the influence of the through-hole 25 does not reach the indentation elastic modulus and the 0.2% yield strength (or the indentation hardness), and for example, is a region of the above-described surrounding region 23 where the influence of the through-hole 25 does not reach and a region between the through-holes 25 adjacent to each other in the effective region 22. Therefore, it is preferred to cut off a region of the surrounding region 23 where the through-hole 25 is not included and perform the nano-indentation test to be described later in the case of investigating the indentation elastic modulus and the 0.2% yield strength (or the indentation hardness) of the metal layer assembly 28' using the completed form of the deposition mask 20, and to perform a tensile test in the case of investigating the 0.2% yield strength. In addition, the region between the through-holes 25 may be cut off even in the effective region 22 as long as a distance between the through-holes 25 adjacent to each other is a distance of a degree at which it is possible to perform the nano-indentation test and the tensile test in the case of investigating the 0.2% yield strength. Incidentally, in general, the composition and quality of the material of the metal layer assembly 28' of the deposition mask 20 do not differ depending on a position in terms of material characteristics. Thus, the material characteristics do not differ between a position close to the through-hole 25 and a position far from the through-hole 25.

In Mode 2, the first opening 30 and the second opening 35 communicate with each other to form the through-hole 25 penetrating the deposition mask 20. In this case, an opening dimension and an opening shape of the through-hole 25 on the first surface 20a side of the deposition mask 20 are defined by the first opening 30 of the first metal layer 32'. On the other hand, an opening dimension and an opening shape of the through-hole 25 on the second surface 20b side of the deposition mask 20 are defined by the second opening 35 of the second metal layer 37'. In other words, both the shape defined by the first opening 30 of the first metal layer 32' and the shape defined by the second opening 35 of the second metal layer 37' are granted to the through-hole 25.

In FIG. 14, the reference sign 40 represents the connecting portion at which the first metal layer 32' and the second metal layer 37' are connected. Incidentally, FIG. 14 illustrates an example in which the first metal layer 32' and the second metal layer 37' are in contact with each other, but the present invention is not limited thereto, and another layer may be interposed between the first metal layer 32' and the second metal layer 37'. For example, a catalyst layer, configured to promote precipitation of the second metal layer 37' on the first metal layer 32', may be provided between the first metal layer 32' and the second metal layer 37'.

Figure 15A:
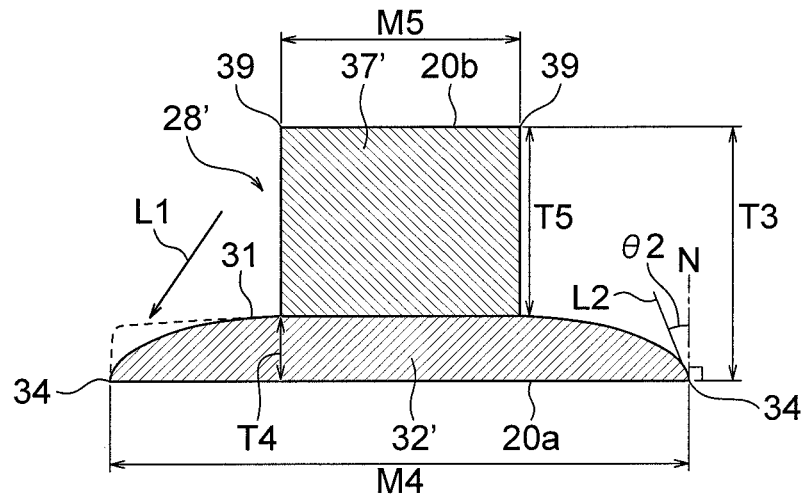
FIG. 15A is a cross-sectional view illustrating each part of a first metal layer and a second metal layer of a deposition mask illustrated in FIG. 14 in an enlarged manner.

FIG. 15A is a view illustrating each part of the first metal layer 32' and the second metal layer 37' of FIG. 14 in an enlarged manner. As illustrated in FIG. 15A, a width M5 of the second metal layer 37' on the second surface 20b of the deposition mask 20 is smaller than a width M4 of the first metal layer 32' on the first surface 20a of the deposition mask 20. In other words, the opening dimension S2 of the through-hole 25 (the second opening 35) on the second surface 20b is larger than the opening dimension S1 of the through-hole 25 (the first opening 30) on the first surface 20a. Hereinafter, advantages obtained by forming the first metal layer 32' and the second metal layer 37' in this manner will be described.

The deposition material 98 flying from the second surface 20b side of the deposition mask 20 sequentially passes through the second opening 35 and the first opening 30 of the through-hole 25 and adheres to the organic EL substrate 92. A region of the organic EL substrate 92 to which the deposition material 98 adheres is mainly determined by the opening dimension S1 and the opening shape of the through-hole 25 on the first surface 20a. Meanwhile, the deposition material 98 not only moves along the normal direction N of the deposition mask 20 from the crucible 94 toward the organic EL substrate 92 but also moves in the direction which is greatly inclined with respect to the normal direction N of the deposition mask 20 as illustrated by an arrow L1 directed from the second surface 20b side to the first surface 20a in FIG. 14. Here, if the opening dimension S2 of the through-hole 25 on the second surface 20b is the same as the opening dimension S1 of the through-hole 25 on the first surface 20a, most of the deposition material 98 moving in the direction that is greatly inclined with respect to the normal direction N of the deposition mask 20 reaches and adheres to the wall surface 36 of the second opening 35 of the through-hole 25 before passing through the through-hole 25 and reaching the organic EL substrate 92. Therefore, it can be said that it is preferable to increase the opening dimension S2 of the second opening 35, that is, to reduce the width M5 of the second metal layer 37' in order to enhance the utilization efficiency of the deposition material 98.

In FIG. 14, an angle formed by the straight line L1 passing through the end 39 of the second metal layer 37' and in contact with the wall surface 31 of the first metal layer 32' with respect to the normal direction N of the deposition mask 20 is represented by a reference sign θ1. It is advantageous to increase the angle θ1 in order to allow the deposition material 98 moving obliquely to reach the organic EL substrate 92 as much as possible without reaching the wall surface 36 of the second opening 35. Upon increasing the angle θ1, it is advantageous to set the width M5 of the second metal layer 37' to be smaller than the width M4 of the first metal layer 32'. As apparent from the drawing, it is advantageous to reduce a thickness T4 of the first metal layer 32' and a thickness T5 of the second metal layer 37' upon increasing the angle θ1. Here, the "thickness T4 of the first metal layer 32'" means a thickness of a portion of the first metal layer 32' that is connected to the second metal layer 37'. Incidentally, it is considered that the strength of the deposition mask 20 decreases when the width M5 of the second metal layer 37, the thickness T5 of the first metal layer 32', and the thickness T5 of the second metal layer 37' are excessively reduced, and thus, the deposition mask 20 is damaged during conveyance or use. For example, it is considered that the deposition mask 20 is damaged by tensile stress applied to the deposition mask 20 when the deposition mask 20 is taut to be installed to the frame 15. When considering these points, it can be said that it is preferable to set dimensions of the first metal layer 32' and the second metal layer 37' within the following ranges. As a result, the above-described angle θ1 can be set to, for example, 45° or larger.

The width M4 of the metal layer 32' on the first surface 20a side: 5 to 25 μm

The width M5 of the second metal layer 37' on the second surface 20b side: 2 to 20 μm A thickness T3 of the deposition mask 20: 1 to 50 μm, more preferably 3 to 30 μm, still more preferably 3 to 25 μm, and still more preferably 3 to 15 μm The thickness T4 of the first metal layer 32': 5 μm or less The thickness T5 of the second metal layer 37' is 0.1 to 50 μm, more preferably 3 to 30 μm, still more preferably 3 to 25 μm, and still more preferably 3 to 15 μm In particular, as the thickness T3 of the deposition mask 20 is set to 15 μm or less, it is possible to produce the deposition mask 20 with a thickness that is difficult to obtain with the deposition mask 20 made of a rolled material to be described later. In this case, it is possible to obtain the deposition mask 20 capable of reducing the influence of shadow and improving the utilization efficiency of the deposition material.

Table 3 shows examples of the number of display pixels and values of a width and a thickness of each portion of the deposition mask 20, which are obtained depending on the number of display pixels, in a 5-inch organic EL display device. Incidentally, the term "FHD" means Full High Definition, the term "WQHD" means Wide Quad High Definition, and the term "UHD" means Ultra High Definition.

TABLE 3

| Number of display pixels | M4 | M5 | T3 | T4 | T5 |
|---|---|---|---|---|---|
| FHD | 30 μm or less | 25 μm or less | 3 to 30 μm | 5 μm or less | 1 to 25 μm |
| WQHD | 25 μm or less | 20 μm or less | 3 to 25 μm | 4 μm or less | 1 to 21 μm |
| UHD | 15 μm or less | 10 μm or less | 3 to 15 μm | 3 μm or less | 0.1 to 15 μm |

Next, the shape of the first metal layer 32' will be described in more detail. When the first metal layer 32' at the end 34 has a shape largely steepened toward the second surface 20b as provisionally illustrated by a dotted line in FIG. 15A, it is considered that most of the deposition material 98 after having passed through the second opening 35 of the through-hole 25 reaches and adheres to the wall surface 31 of the first metal layer 32'. In order to suppress such adhesion of the deposition material 98 to the first metal layer 32' in the vicinity of the end 34, it is preferable that the first metal layer 32' have a thickness smaller than the thickness T4 of a part of the first metal layer 32' in contact with the second metal layer 37' at the end 34 and in the vicinity of the end 34 as illustrated in FIG. 15A. For example, as illustrated in FIG. 15A, it is preferable that the thickness of the first metal layer 32' decrease from the part of the first metal layer 32' connected to the second metal layer 37' toward the end 34. Such a shape of the first metal layer 32' can be realized by forming the first metal layer 32' by the plating process as will be described later.

Figure 15B:
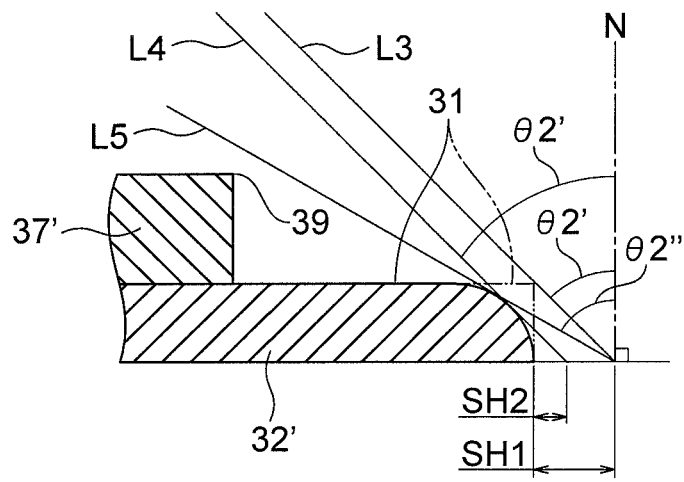
FIG. 15B is a schematic cross-sectional view illustrating each part of the first metal layer and the second metal layer illustrated in FIG. 15A in a further enlarged manner.

A straight line L2 in contact with the wall surface 31 of the first metal layer 32' without passing through the end 39 of the second metal layer 37' from the deposition machine is illustrated in FIG. 15A. An angle formed by the straight line L2 with respect to the normal direction N of the deposition mask 20 is denoted by a reference sign θ2. This angle θ2 is smaller than the above-described angle θ1 because the straight line L2 does not pass through the end 39. When the deposition mask 20 is applied to a deposition machine having a deposition angle φ (=90°-θ2) corresponding to such an angle θ2, shadow as illustrated in FIG. 15B can be generated. Here, the angle θ2 will be described in more detail with reference to FIG. 15B.

FIG. 15B illustrates that shadow SH1 can be generated when the angle formed by a straight line L3 passing through a corner of the wall surface 31 of the first metal layer 32' formed in a rectangular shape as indicated by a two-dot chain line with respect to the normal direction N is θ2'. When the wall surface 31 is formed in a rectangular shape in this manner, it is possible to reduce the shadow by reducing the thickness. In this case, however, the strength of the deposition mask 20 may decrease.

On the other hand, shadow that can be generated by a straight line L4 having the angle θ2' in contact with the wall surface 31 formed in a curved shape is SH2 as illustrated in FIG. 15B. This shadow SH2 is smaller than the above-described shadow SH1. As a result, the shadow can be made smaller in the case where the wall surface 31 is formed in the curved shape more than in the case where the wall surface 31 is formed in the rectangular shape. In other words, in order to obtain the same shadow, the angle of the straight line in contact with the wall surface 31 can be made larger in the case where the wall surface 31 is formed in the curved shape than in the case where the wall surface 31 is formed in the rectangular shape. That is, even when an angle of a straight line L5 in contact with the curved wall surface 31 is θ2" larger than θ2' as illustrated in FIG. 15B, the shadow to be obtained is SH1. As a result, the deposition mask 20 having the wall surface 31 formed in the curved shape can be applied to a deposition machine in which the angle θ2 can be increased, that is, the deposition angle φ can be reduced. In addition, the angle of the straight line in contact with the wall surface 31 is increased by forming the wall surface 31 in the curved shape even if the thickness of the first metal layer 32' is not reduced, so that it is also possible to secure the strength of the deposition mask 20.

In this manner, it is preferred to make the deposition mask 20 applicable to the deposition machine illustrated in FIG. 15A in which the angle θ2 can be increased. For example, the deposition mask 20 can be applied to a deposition machine in which the angle μ2 can be preferably 30° or larger, and more preferably 45° or larger by forming the wall surface 31 in the curved shape as described above.

Such a curved shape of the wall surface 31 can also be realized by forming the first metal layer 32' by the plating process. Incidentally, the "wall surface 31" is a surface that defines the first opening 30 among surfaces of the first metal layer 32'. Similarly, the above-described "wall surface 36" is a surface defining the second opening 35 among surfaces of the second metal layer 37'.

(Method of Manufacturing Deposition Mask)

Next, the method of manufacturing the deposition mask 20 having the above-described configuration will be described with reference to FIGS. 16 to 21B.

First, a step of forming the metal layer assembly 28' (mask body) provided with the through-holes 25 on the base material 51' to be described later by the plating process is performed. Specifically, this step has a first film formation step and a second film formation step which will be described later.

(First Film Formation Step)

Figure 16:
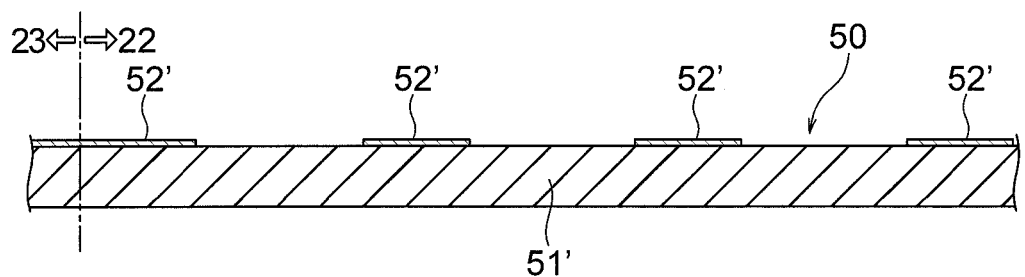
FIG. 16 is a cross-sectional view illustrating a pattern substrate including a conductive pattern formed on the base material.

First, the first film formation step of forming the first metal layer 32' provided with the first openings 30 in the predetermined pattern on the insulating base material 51' will be described. First, a preparation step of preparing a pattern substrate 50 having the insulating base material 51' and a conductive pattern 52' formed on the base material 51' is performed as illustrated in FIG. 16. The conductive pattern 52' has a pattern corresponding to the first metal layer 32'. A material forming the base material 51' and a thickness of the base material 51' are not particularly limited as long as the base material 51' has the insulating property and appropriate strength. For example, glass, a synthetic resin, or the like can be used as the material forming the base material 51'.

A material having conductivity, such as a metal material and an oxide conductive material, is appropriately used as the material forming the conductive pattern 52'. Examples of the metal material can include chromium, copper, and the like. Preferably, a material having high adhesion with respect to a resist pattern 60, which will be described later, is used as the material forming the conductive pattern 52'. For example, when the resist pattern 60' is produced by patterning what is called a dry film, such as a resist film containing an acrylic photocurable resin, it is preferable to use copper having high adhesion with respect to the dry film as the material forming the conductive pattern 52'.

As will be described later, the first metal layer 32' is formed on the conductive pattern 52' so as to cover the conductive pattern 52, and the first metal layer 32' is separated from the conductive pattern 52' in the subsequent step. For example, the thickness of the conductive pattern 52' is in a range of 50 to 500 nm.

Figure 17A:
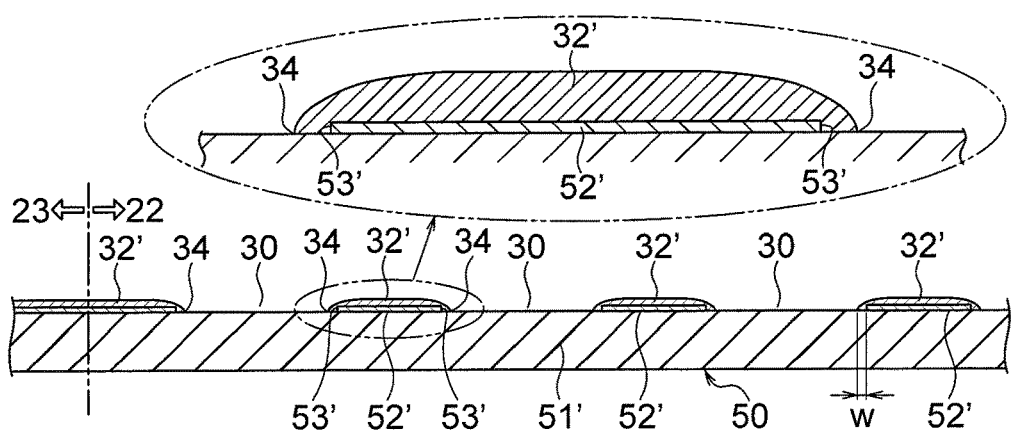
FIG. 17A is a cross-sectional view illustrating a first plating process step of precipitating the first metal layer on a conductive pattern.
Figure 17B:
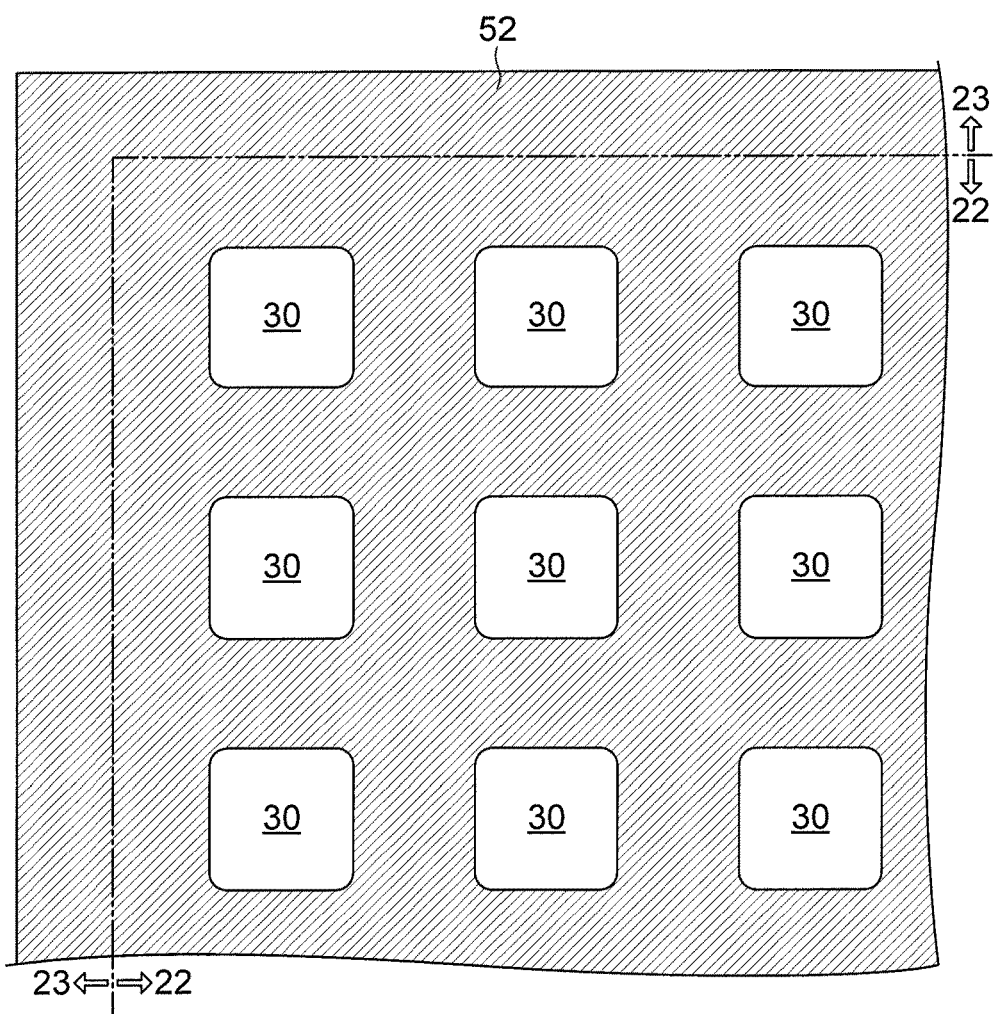
FIG. 17B is a plan view illustrating the first metal layer of FIG. 17A.

Next, a first plating process step of supplying a first plating solution onto the base material 51' on which the conductive pattern 52' has been formed to precipitate the first metal layer 32' on the conductive pattern 52' is performed. For example, the base material 51' on which the conductive pattern 52' has been formed is immersed in a plating tank filled with the first plating solution. As a result, the first metal layer 32' provided with the first openings 30 in the predetermined pattern can be obtained on the pattern substrate 50 as illustrated in FIG. 17A. FIG. 17B is a plan view illustrating the first metal layer 32' formed on the base material 51'.

Incidentally, the first metal layer 32' can be formed not only in a portion overlapping with the conductive pattern 52' when viewed along the normal direction of the base material 51' but also in a portion that does not overlap with the conductive portion 52' as illustrated in FIG. 17A in terms of characteristics of the plating process. This is because the first metal layer 32' is further precipitated on the surface of the first metal layer 32' which has been precipitated on the portion overlapping with an end 53' of the conductive pattern 52'. As a result, the end 34 of the first metal layer 32' can be positioned in a portion that does not overlap with the conductive pattern 52' when viewed along the normal direction of the base material 51' as illustrated in FIG. 17A. On the other hand, the thickness of the first metal layer 32' at the end 34 and in the vicinity of the end 34 is smaller than the thickness thereof at the central portion by the amount of precipitation of metal proceeding not in the thickness direction but in a plate plane direction of the base material 51'. For example, as illustrated in FIG. 17A, the thickness of the first metal layer 32' decreases at least partially from the center portion of the first metal layer 32' toward the end 34, and the end 34 and the vicinity thereof (or the wall surface 31) are formed in a curved shape. As a result, it is possible to reduce the deposition angle φ (increase the angle θ2) of the applicable deposition machine as described above.

In FIG. 17A, a width of the portion of the first metal layer 32' that does not overlap with the conductive pattern 52' is represented by a reference sign w. The width w falls within a range of, for example, 0.5 to 5.0 μm. A dimension of the conductive pattern 52' is set in consideration of this width w.

A specific method of the first plating process step is not particularly limited as long as the first metal layer 32' can be precipitated on the conductive pattern 52'. For example, the first plating process step may be performed as a so-called electrolytic plating process step of causing an electric current to flow through the conductive pattern 52' to precipitate the first metal layer 32' on the conductive pattern 52'. Alternatively, the first plating process step may be an electroless plating process step. Incidentally, when the first plating process step is the electroless plating process step, an appropriate catalyst layer is provided on the conductive pattern 52'. The catalyst layer may be provided on the conductive pattern 52' even when the electrolytic plating process step is performed.

Components of the first plating solution to be used are appropriately determined depending on characteristics required for the first metal layer 32'. For example, when the first metal layer 32' is made of an iron alloy containing nickel, a mixed solution of a solution containing a nickel compound and a solution containing an iron compound can be used as the first plating solution. For example, a mixed solution of a solution containing nickel sulfamate or nickel bromide and a solution containing ferrous sulfamate can be used. The plating solution may contain various additives. Examples of the additives may include a pH buffer such as boric acid or an additive such as malonic acid and saccharin.

(Second Film Formation Step)

Figure 18A:
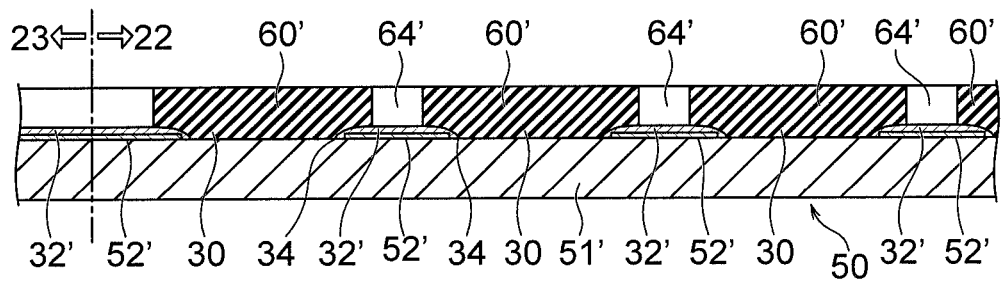
FIG. 18A is a cross-sectional view illustrating a resist formation step of forming a resist pattern on a pattern substrate and on the first metal layer.
Figure 18B:
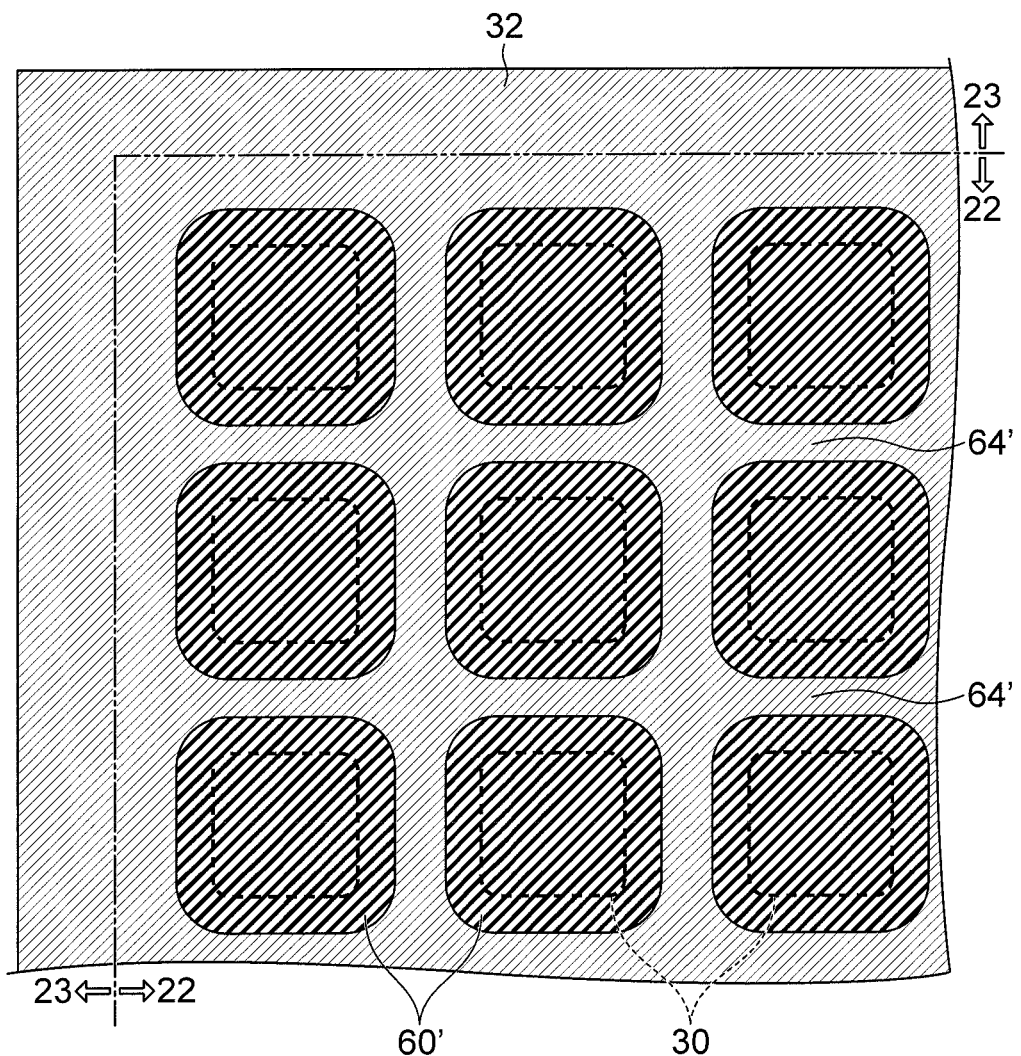
FIG. 18B is a plan view illustrating the resist pattern of FIG. 18A.

Next, a second film formation step of forming the second metal layer 37' provided with the second openings 35 communicating with the first openings 30 on the first metal layer 32' is performed. First, a resist formation step of forming the resist pattern 60' with a predetermined gap 64' on the base material 51' of the pattern substrate 50 and on the first metal layer 32' is performed. FIGS. 18A and 18B are a cross-sectional view and a plan view illustrating the resist pattern 60' formed on the base material 51'. As illustrated in FIGS. 18A and 18B, the resist formation step is performed such that the first opening 30 of the first metal layer 32' is covered with the resist pattern 60' and the gap 64' of the resist pattern 60' is positioned on the first metal layer 32'.

Hereinafter, an example of the resist formation step will be described. First, a negative-type resist film is formed by pasting a dry film on the base material 51' of the pattern substrate 50 and the first metal layer 32'. Examples of the dry film can include a film containing an acrylic photocurable resin such as RY3310 manufactured by Hitachi Chemical Co., Ltd. Next, an exposure mask configured to prevent light from passing through a region that needs to be the gap 64' out of the resist film is prepared, and the exposure mask is arranged on the resist film. Thereafter, the exposure mask is sufficiently brought into close contact with the resist film by vacuum adhesion. Incidentally, a positive-type resist film may be used. In this case, an exposure mask configured to allow light to pass through a region that is desirably removed out of the resist film is used as the exposure mask.

Thereafter, the resist film is exposed to light through the exposure mask. Further, the resist film is developed to form an image on the exposed resist film. In the above-described manner, it is possible to form the resist pattern 60' provided with the gap 64' positioned on the first metal layer 32' and covering the first opening 30 of the first metal layer 32' as illustrated in FIGS. 18A and 18B. Incidentally, a heat treatment step of heating the resist pattern 60' after the development step may be performed in order to more strongly cause the resist pattern 60' to be brought into close contact with the base material 51' and the first metal layer 32'.

Next, a second plating process step of supplying a second plating solution to the gap 64' of the resist pattern 60' to precipitate the second metal layer 37' on the first metal layer 32' is performed. For example, the base material 51' on which the first metal layer 32' has been formed is immersed in a plating tank filled with the second plating solution. As a result, the second metal layer 37' can be formed on the first metal layer 32' as illustrated in FIG. 19.

A specific method of the second plating process step is not particularly limited as long as the second metal layer 37' can be precipitated on the first metal layer 32'. For example, the second plating process step may be performed as a so-called electrolytic plating process step of causing an electric current to flow through the first metal layer 32' to precipitate the second metal layer 37' on the first metal layer 32'. Alternatively, the second plating process step may be an electroless plating process step. Incidentally, when the second plating process step is the electroless plating process step, an appropriate catalyst layer is provided on the first metal layer 32'. The catalyst layer may be provided on the first metal layer 32' even when the electrolytic plating process step is performed.

A plating solution which is the same as the above-described first plating solution may be used as the second plating solution. Alternatively, a plating solution different from the first plating solution may be used as the second plating solution. When the composition of the first plating solution and the composition of the second plating solution are the same, the composition of metal forming the first metal layer 32' and the composition of metal forming the second metal layer 37' also become the same.

Figure 19:
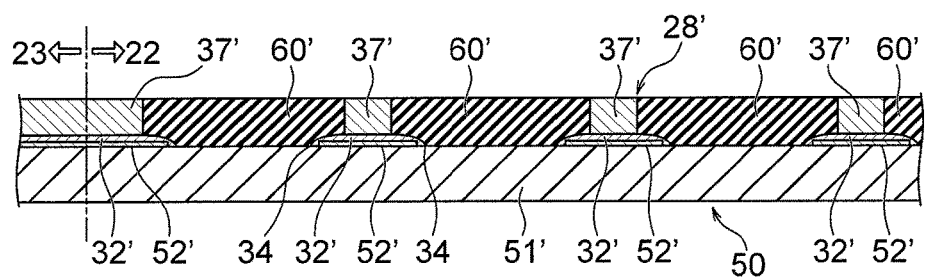
FIG. 19 is a cross-sectional view illustrating a second plating process step of precipitating the second metal layer on the first metal layer.

Incidentally, FIG. 19 illustrates an example in which the second plating process step is continued until an upper surface of the resist pattern 60' and an upper surface of the second metal layer 37' coincide with each other, but the present invention is not limited thereto. The second plating process step may be stopped in a state where the upper surface of the second metal layer 37' is positioned lower than the upper surface of the resist pattern 60'.

In this manner, the second metal layer 37' is formed on the first metal layer 32', and the metal layer assembly 28' having the first metal layer 32' and the second metal layer 37' illustrated in FIGS. 14 and 15A is obtained.

(Removal Step)

Figure 20:
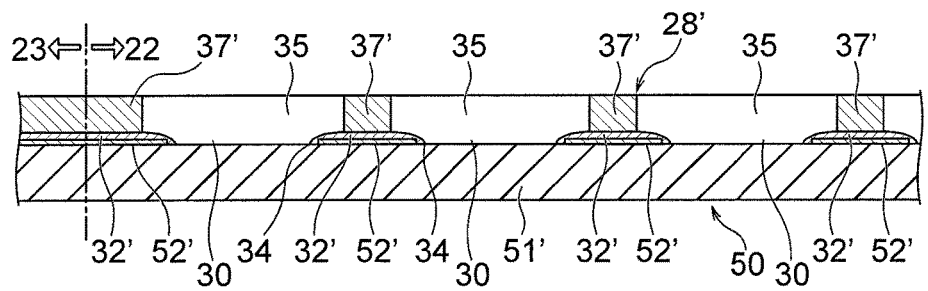
FIG. 20 is a view illustrating a removal step of removing the resist pattern.

Thereafter, a removal step of removing the resist pattern 60' is performed as illustrated in FIG. 20. For example, the resist pattern 60' can be peeled off from the base material 51', the first metal layer 32', and the second metal layer 37' by using an alkali-based peeling solution.

(Separation Step)

Figure 21A:
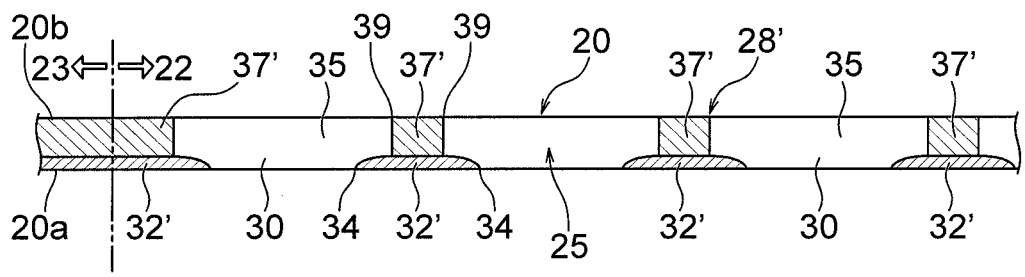
FIG. 21A is a view illustrating a separation step of separating a metal layer assembly from the pattern substrate.
Figure 21B:
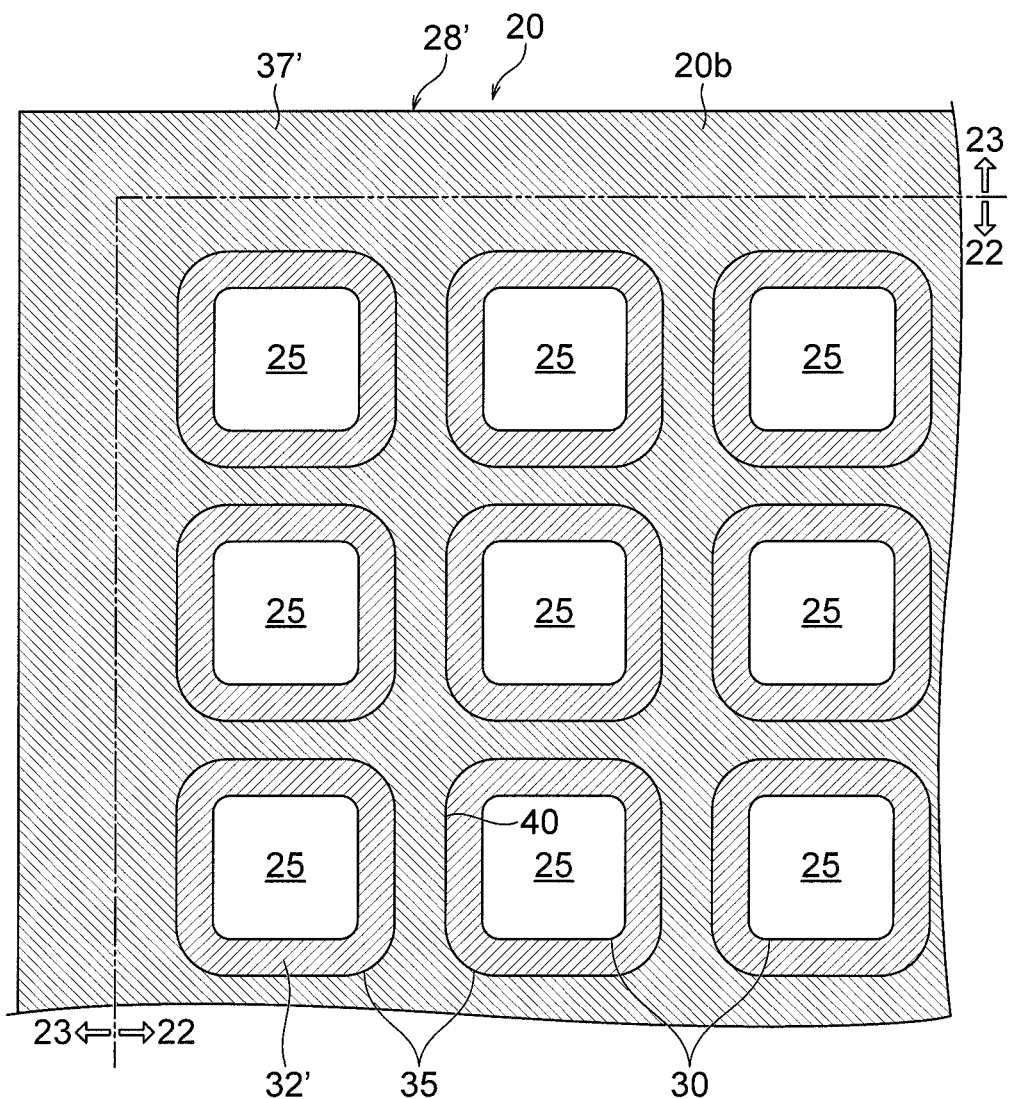
FIG. 21B is a plan view illustrating a case where the deposition mask of FIG. 11A is viewed from the second surface side.

Next, a separation step of separating the metal layer assembly 28' having the first metal layer 32' and the second metal layer 37' from the base material 51' of the pattern substrate 50 is performed. As a result, it is possible to obtain the deposition mask 20 that includes the first metal layer 32' provided with the first openings 30 in the predetermined pattern and the second metal layer 37' provided with the second openings 35 communicating with the first openings 30 as illustrated in FIG. 21A. FIG. 21B is a plan view illustrating a case where the deposition mask 20 is viewed from the second surface 20b side.

Hereinafter, an example of the separation step will be described in detail. First, a film provided with a substance having stickiness by coating or the like is pasted to the metal layer assembly 28' formed on the base material 51'. Next, the film is pulled away from the base material 51' by pulling up or rolling the film, and as a result, the metal layer assembly 28' is separated from the base material 51' of the pattern substrate 50. Thereafter, the film is peeled off from the metal layer assembly 28'. In addition, a gap serving as a trigger for separation is formed between the metal layer assembly 28' and the base material 51' first in the separation process, and then, air is blown to the gap so as to promote the separation step.

Incidentally, a substance which loses stickiness by being irradiated with light such as UV or by being heated may be used as the substance having stickiness. In this case, a step of irradiating the film with light or a step of heating the film is performed after separating the metal layer assembly 28' from the base material 51'. As a result, it is possible to make the step of peeling off the film from the metal layer assembly 28' easy. For example, the film can be peeled off in a state where the film and the metal layer assembly 28' are kept to be parallel to each other as much as possible. As a result, it is possible to prevent the metal layer assembly 28' from being curved when the film is peeled off, which makes it possible to prevent the deposition mask 20 from being deformed such as curvature.

According to the above-described Mode 2, the deposition mask 20 is produced by supplying the second plating solution to the gap 64' of the resist pattern 60' to precipitate the second metal layer 37' on the first metal layer 32' as described above. Thus, it is possible to grant both the shape defined by the first opening 30 of the first metal layer 32' and the shape defined by the second opening 35 of the second metal layer 37' to the through-hole 25 of the deposition mask 20. Therefore, it is possible to precisely form the through-hole 25 having a complicated shape. For example, it is possible to obtain the through-hole 25 capable of increasing the above-described angle θ1. In particular, the end 34 of the first metal layer 32' and the vicinity thereof can be formed in a curved shape to be larger than that of Mode 3 to be described later, and thus, the angle θ1 can be further increased. As a result, the utilization efficiency of the deposition material 98 can be enhanced. In other words, since the end 34 and the vicinity thereof are formed in the curved shape, the thickness of the first metal layer 32' for the predetermined angle θ1 can be made larger than that of the case where the degree of curvature is small, and it is possible to increase the strength of the first metal layer 32', for example, the strength against ultrasonic cleaning. In addition, it is possible to set the thickness T3 of the deposition mask 20 at random independently of the shape of the through-hole 25 by forming the second metal layer 37' using the plating process. Thus, it is possible to make the deposition mask 20 have sufficient strength. Therefore, it is possible to produce the high-definition organic EL display device and to provide the deposition mask 20 with excellent durability. Further, since the end 34 of the first metal layer 32' and the vicinity thereof are formed in the curved shape as described above, it is possible to reduce the deposition angle φ (increase the angle θ2) of the deposition device to which the deposition mask 20 can be applied.

[Mode 3: Another Example of Method of Manufacturing Deposition Mask Having Two-Layer Structure by Plating Process]

Next, another example of the method of manufacturing the deposition mask having the two-layer structure by the plating process will be described. Since the structure of the deposition mask 20 to be manufactured by the manufacturing method is substantially the same as that of Mode 2 illustrated in FIG. 14, a detailed description thereof will be omitted here. Hereinafter, the method of manufacturing the deposition mask 20 in Mode 3 will be described with reference to FIGS. 22 to 28.

First, a step of forming the metal layer assembly 28' (mask body) provided with the through-holes 25 on a base material 51" to be described later by the plating process is performed. Specifically, this step has a first film formation step and a second film formation step which will be described later.

(First Film Formation Step)

Figure 22:
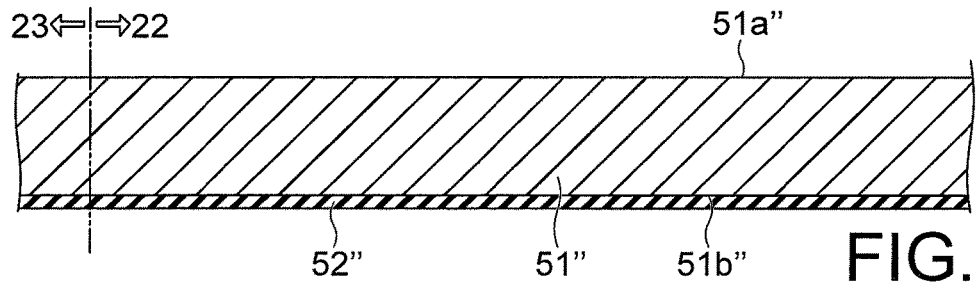
FIG. 22 is a cross-sectional view illustrating a base material having a front surface and a back surface according to a mode 3.

First, a preparation step of preparing the base material 51", which serves as a base during the plating process, is performed as illustrated in FIG. 22. Here, an example in which the plating process is an electrolytic plating process will be described. In this case, at least a portion of a front surface 51a" of the base material 51" on which the first metal layer 32' is precipitated is formed of a conductive layer having conductivity. For example, the entire base material 51" may be formed of the conductive layer having conductivity. In this case, a cover film 52" having an insulating property, configured to prevent a back surface 51b" from being conducted to another member, may be provided on the back surface 51b" positioned on the opposite side of the front surface 51a" of the base material 51".

A material forming the conductive layer of the base material 51" is not particularly limited as long as predetermined metal can be precipitated during the plating process to be described later. For example, a material having conductivity, such as a metal material and an oxide conductive material, is appropriately used as the material forming the conductive layer of the base material 51". Examples of the metal material can include stainless steel, copper, and the like. Preferably, a material having high adhesion with respect to a first resist pattern 60A, which will be described later, is used as the material forming the conductive layer of the base material 51". For example, when the first resist pattern 60A is produced by patterning what is called a dry film, such as a resist film containing an acrylic photocurable resin, it is preferable to use copper having high adhesion with respect to the dry film as the material forming the conductive layer of the base material 51".

Figure 23:
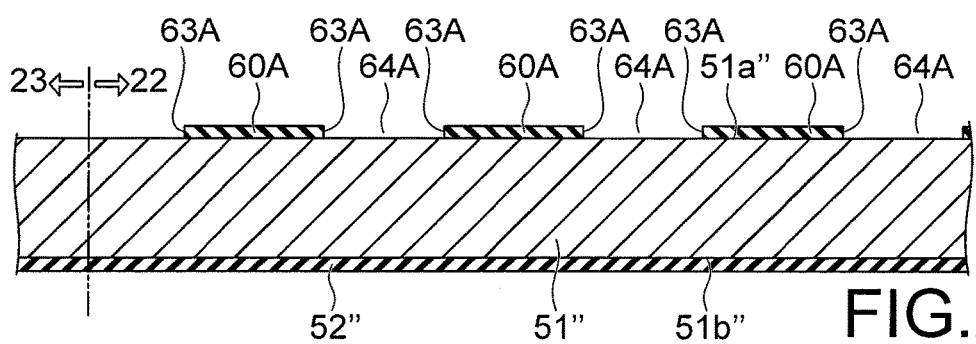
FIG. 23 is a view illustrating a first resist formation step of forming a first resist pattern on the base material.

Next, a first resist formation step of forming the first resist pattern 60A with a predetermined first gap 64A on the front surface 51a" of the base material 51" is performed. FIG. 23 is a cross-sectional view illustrating the base material 51" on which the first resist pattern 60A is formed. As illustrated in FIG. 23, the first resist pattern 60A includes a side surface 63A facing the first gap 64A.

In the first resist formation step, first, a negative-type resist film is formed by pasting a dry film on the front surface 51a" of the base material 51". Examples of the dry film can include a film containing an acrylic photocurable resin such as RY3310 manufactured by Hitachi Chemical Co., Ltd. Next, an exposure mask configured to prevent light from passing through a region that needs to be the first gap 64A out of the resist film is prepared, and the exposure mask is arranged on the resist film. Thereafter, the exposure mask is sufficiently brought into close contact with the resist film by vacuum adhesion. Incidentally, a positive-type resist film may be used. In this case, an exposure mask configured to allow light to pass through a region that is desirably removed out of the resist film is used as the exposure mask.

Thereafter, the resist film is exposed to light through the exposure mask. Further, the resist film is developed to form an image on the exposed resist film. In the above-described manner, the first resist pattern 60A illustrated in FIG. 23 can be formed. Incidentally, a heat treatment step of heating the first resist pattern 60A after the development step may be performed in order to more strongly cause the first resist pattern 60A to be brought into close contact with the front surface 51a" of the base material 51".

Next, a first plating process step of supplying a first plating solution onto the base material 51" on which the first resist pattern 60A has been formed to precipitate the first metal layer 32' on the base material 51" in the first gap 64A is performed. For example, the base material 51" on which the first resist pattern 60A has been formed is immersed in a plating tank filled with the first plating solution. As a result, the first metal layer 32' provided with the first openings 30 in a predetermined pattern can be obtained on the base material 51" as illustrated in FIG. 24.

Figure 24:
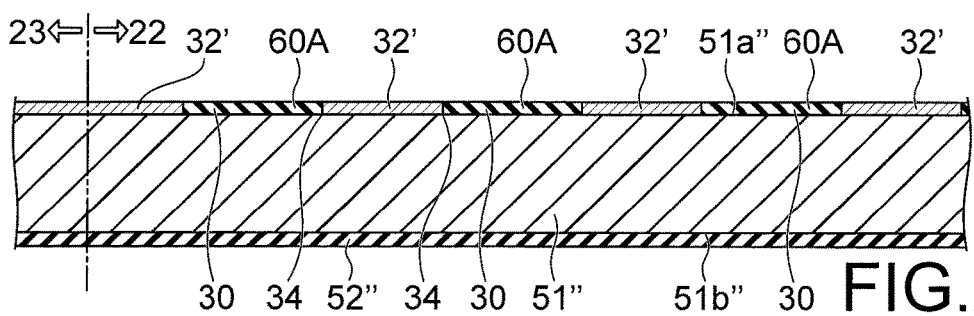
FIG. 24 is a cross-sectional view illustrating a first plating process step of precipitating a first metal layer on the base material.

Incidentally, the first metal layer 32' is precipitated to grow in the normal direction of the base material 51" as illustrated in FIG. 24 in terms of the characteristics of the plating process. However, the first plating solution is difficult to enter due to the presence of the first resist pattern 60A in the vicinity of the side surface 63A facing the first gap 64A of the first resist pattern 60A, so that a precipitation rate of a metal material decreases. As a result, the end 34 of the first metal layer 32' and the vicinity thereof can be formed in a curved shape as illustrated in FIGS. 14 and 15A. Incidentally, the end 34 and the vicinity thereof are illustrated in a rectangular shape in FIGS. 24 to 28 in order to clarify the drawing.

A specific method of the first plating process step is not particularly limited as long as the first metal layer 32' can be precipitated on the base material 51". For example, the first plating process step may be performed as a so-called electrolytic plating process step of causing an electric current to flow through the base material 51" to precipitate the first metal layer 32' on the base material 51". Alternatively, the first plating process step may be an electroless plating process step. Incidentally, when the first plating process step is the electroless plating process step, an appropriate catalyst layer is provided on the base material 51". The catalyst layer may be provided on the base material 51" even when the electrolytic plating process step is performed.

Components of the first plating solution can be set to be the same as those of the first plating solution described in Mode 2, a detailed description thereof will be omitted here.

(Second Film Formation Step)

Figure 25:
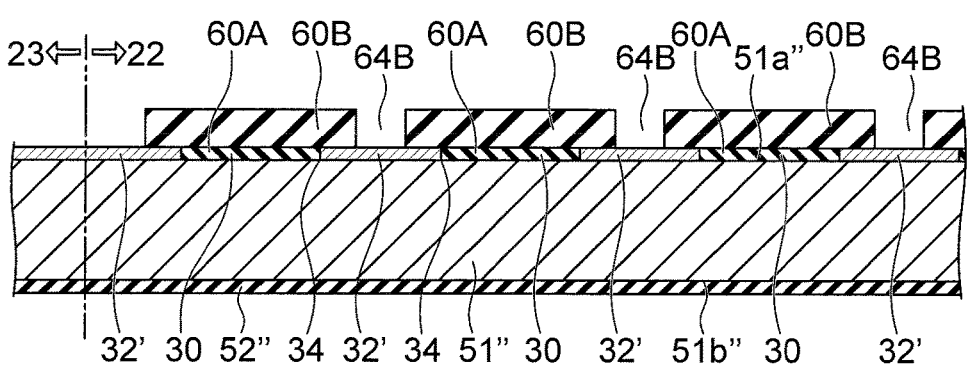
FIG. 25 is a cross-sectional view illustrating a second resist formation step of forming a second resist pattern on the first resist pattern and the first metal layer.

Next, a second film formation step of forming the second metal layer 37' provided with the second openings 35 communicating with the first openings 30 on the first metal layer 32' is performed. First, a second resist formation step of forming a second resist pattern 60B with a predetermined second gap 64B on the first resist pattern 60A and the first metal layer 32' is performed. FIG. 25 is the cross-sectional view illustrating the second resist pattern 60B formed on the first resist pattern 60A and the first metal layer 32'. As illustrated in FIG. 25, the second resist formation step is performed such that the first opening 30 of the first metal layer 32' is covered with the second resist pattern 60B and the second gap 64B of the second resist pattern 60B is positioned on the first metal layer 32'.

Since the step of forming the second resist pattern 60B can be performed in the same manner as the above-described step of forming the first resist pattern 60A, a detailed description thereof will be omitted here.

Next, a second plating process step of supplying a second plating solution to the second gap 64B of the second resist pattern 60B to precipitate the second metal layer 37' on the first metal layer 32' is performed. For example, the base material 51" on which the first metal layer 32' has been formed is immersed in a plating tank filled with the second plating solution. As a result, the second metal layer 37' can be formed on the first metal layer 32' as illustrated in FIG. 26.

A specific method of the second plating process step is not particularly limited as long as the second metal layer 37' can be precipitated on the first metal layer 32'. For example, the second plating process step may be performed as a so-called electrolytic plating process step of causing an electric current to flow through the first metal layer 32' to precipitate the second metal layer 37' on the first metal layer 32'. Alternatively, the second plating process step may be an electroless plating process step. Incidentally, when the second plating process step is the electroless plating process step, an appropriate catalyst layer is provided on the first metal layer 32'. The catalyst layer may be provided on the first metal layer 32' even when the electrolytic plating process step is performed.

A plating solution which is the same as the above-described first plating solution may be used as the second plating solution. Alternatively, a plating solution different from the first plating solution may be used as the second plating solution. When the composition of the first plating solution and the composition of the second plating solution are the same, the composition of metal forming the first metal layer 32' and the composition of metal forming the second metal layer 37' also become the same.

Figure 26:
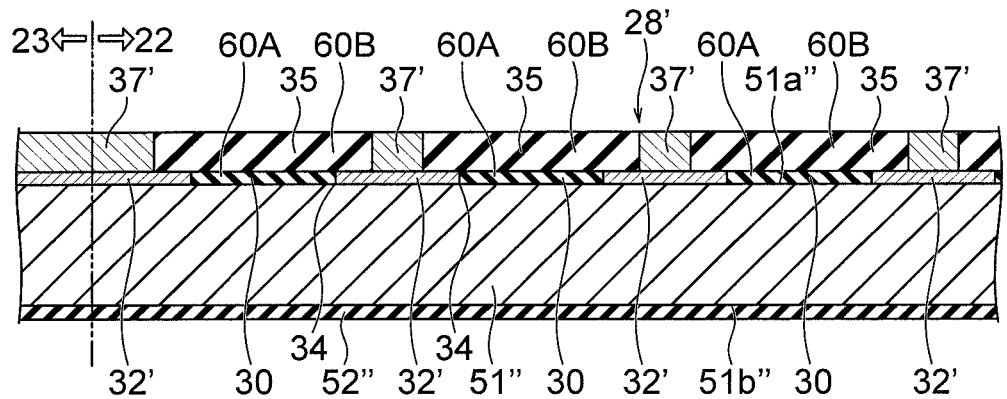
FIG. 26 is a cross-sectional view illustrating a second plating process step of precipitating a second metal layer on the first metal layer.

Incidentally, FIG. 26 illustrates an example in which the second plating process step is continued until an upper surface of the second resist pattern 60B and an upper surface of the second metal layer 37' coincide with each other, but the present invention is not limited thereto. The second plating process step may be stopped in a state where the upper surface of the second metal layer 37' is positioned lower than the upper surface of the second resist pattern 60B.

In this manner, the second metal layer 37' is formed on the first metal layer 32', and the metal layer assembly 28' having the first metal layer 32' and the second metal layer 37' illustrated in FIGS. 14 and 15A is obtained.

(Removal Step)

Figure 27:
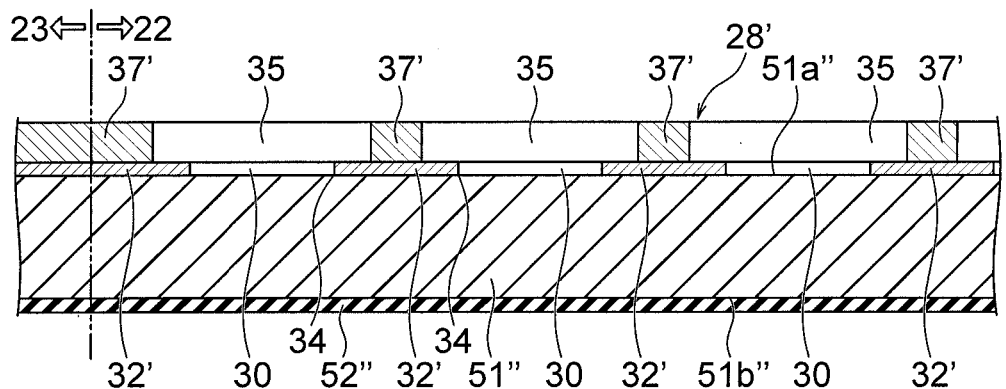
FIG. 27 is a view illustrating a removal step of removing the first resist pattern and the second resist pattern.

Thereafter, a removal step of removing the first resist pattern 60A and the second resist pattern 60B is performed as illustrated in FIG. 27. For example, the first resist pattern 60A and the second resist pattern 60B can be peeled off from the base material 51", the first metal layer 32', and the second metal layer 37' by using an alkali-based peeling solution.

(Separation Step)

Figure 28:
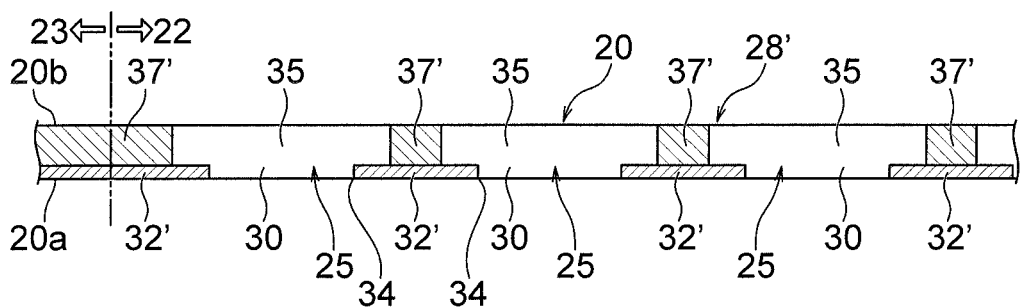
FIG. 28 is a view illustrating a separation step of separating a metal layer assembly from a pattern substrate.

Next, a separation step of separating the metal layer assembly 28' having the first metal layer 32' and the second metal layer 37' from the base material 51" is performed. As a result, it is possible to obtain the deposition mask 20 that includes the first metal layer 32' provided with the first openings 30 in the predetermined pattern and the second metal layer 37' provided with the second openings 35 communicating with the first openings 30 as illustrated in FIG. 28. The separation step can be performed in the same manner as the separation step in the above-described Mode 2.

According to the above-described Mode 3, the deposition mask 20 is produced by supplying the first plating solution to the first gap 64A of the first resist pattern 60A to precipitate the first metal layer 32' and supplying the second plating solution to the second gap 64B of the second resist pattern 60B to precipitate the second metal layer 37' on the first metal layer 32' as described above. Thus, it is possible to grant both the shape defined by the first opening 30 of the first metal layer 32' and the shape defined by the second opening 35 of the second metal layer 37' to the through-hole 25 of the deposition mask 20. Therefore, it is possible to precisely form the through-hole 25 having a complicated shape. For example, it is possible to obtain the through-hole 25 capable of increasing the above-described angle θ1. As a result, the utilization efficiency of the deposition material 98 can be enhanced. In addition, it is possible to set the thickness T3 of the deposition mask 20 at random independently of the shape of the through-hole 25 by forming the second metal layer 37' using the plating process. Thus, it is possible to make the deposition mask 20 have sufficient strength. Therefore, it is possible to produce the high-definition organic EL display device and to provide the deposition mask 20 with excellent durability.

[Mode 4: Deposition Mask Produced by Etching]

The case where the deposition mask 20 is produced by the plating process has been described in the examples illustrated in FIGS. 3 to 28 described above. However, a method adopted for producing the deposition mask 20 is not limited to the plating process. Hereinafter, an example in which the deposition mask 20 is produced by forming the through-hole 25 in the metal plate 21 by etching will be described. Here, the metal plate 21 is a plate material used to produce the deposition mask 20 for depositing the deposition material 98 on the organic EL substrate 92 by etching, having the plurality of through-holes 25 formed therein.

That is, the deposition mask 20 in this Mode 4 includes the metal plate 21 (mask body) and the above-described plurality of through-holes 25 provided in the metal plate 21 as illustrated in FIG.

Among them, the metal plate 21 satisfies the above Formula (1) similarly to the above-described metal layer 28.

Here, in the present specification, the term "metal plate 21" means a concept of a member (having a simple plate shape) in a state where the through-hole 25 is not formed therein, which is similar to the above-described metal layer 28. That is, in the present specification, conceptually, the deposition mask 20 has the configuration in which the metal plate 21 is provided with the plurality of through-holes 25 as a concept different from the metal plate 21. As a result, the expression that the metal plate 21 satisfies the above Formula (1) means that the metal plate 21 in the state where the through-hole 25 is not formed therein satisfies the above Formula (1), and does not mean that the metal plate 21 in the state where the through-hole 25 is formed therein satisfies the above Formula (1). It is considered that the indentation elastic modulus and the 0.2% yield strength (or the indentation hardness) of the metal plate 21 in the state where the through-hole 25 is formed therein are affected by the size, pitch, shape, and the like of the through-hole 25. Thus, in the state where the plurality of through-holes 25 are formed in the metal plate 21 as a completed form of the deposition mask 20, a region of the metal plate 21 satisfying the above formula (1) is a region where the through-hole 25 is not formed, more specifically, a region where the influence of the through-hole 25 does not reach the indentation elastic modulus and the 0.2% yield strength (or the indentation hardness), and for example, is a region of the above-described surrounding region 23 where the influence of the through-hole 25 does not reach and a region between the through-holes 25 adjacent to each other in the effective region 22. Therefore, it is preferred to cut off a region of the surrounding region 23 where the through-hole 25 is not included and perform the nano-indentation test to be described later in the case of investigating the indentation elastic modulus and the 0.2% yield strength (or the indentation hardness) of the metal plate 21 using the completed form of the deposition mask 20, and to perform a tensile test in the case of investigating the 0.2% yield strength. In addition, the region between the through-holes 25 may be cut off even in the effective region 22 as long as a distance between the through-holes 25 adjacent to each other is a distance of a degree at which it is possible to perform the nano-indentation test and the tensile test in the case of investigating the 0.2% yield strength. Incidentally, in general, the composition and quality of the material of the metal plate 21 of the deposition mask 20 do not differ depending on a position in terms of material characteristics. Thus, the material characteristics do not differ between a position close to the through-hole 25 and a position far from the through-hole 25.

Figure 29:
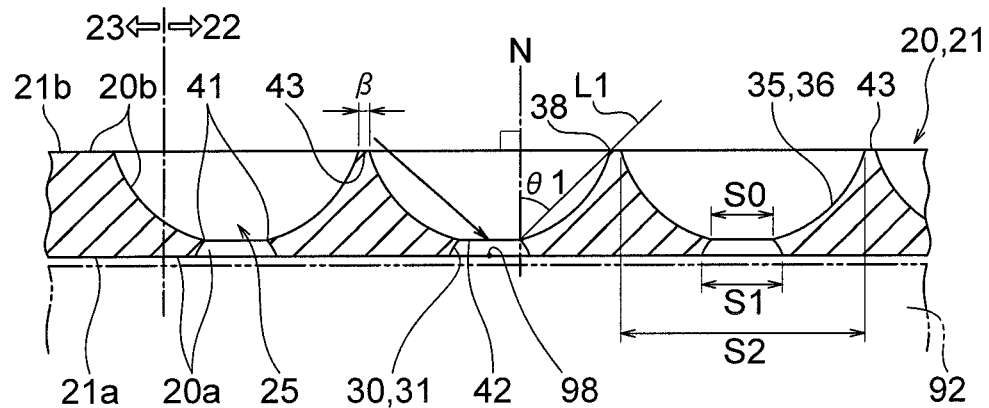
FIG. 29 is a view illustrating an example of a cross-sectional shape of a deposition mask according to a mode 4.

FIG. 29 is a cross-sectional view illustrating a case where the deposition mask 20 produced by using etching is cut along the line A-A of FIG. 3. In the example illustrated in FIG. 29, the first opening 30 is formed by etching on the first surface 21a of the metal plate 21, which is one side in the normal direction of the deposition mask, and the second opening 35 is formed by etching on the second surface 21b which is the other side in the normal direction of the metal plate 21 as will be described in detail later. The first opening 30 is connected to the second opening 35 so that the second opening 35 and the first opening 30 are formed to communicate with each other. The through-hole 25 is formed of the second opening 35 and the first opening 30 connected to the second opening 35.

As illustrated in FIG. 29, the cross-sectional area of each of the first openings 30 in a cross section along a plate plane of the deposition mask 20 at each position along the normal direction of the deposition mask 20 gradually decreases from a side of the first surface 20a to a side of the second surface 20b of the deposition mask 20. Similarly, the cross-sectional area of each of the second openings 35 in a cross section along the plate plane of the deposition mask 20 at each position along the normal direction of the deposition mask 20 gradually decreases from the side of the second surface 20b to the side of the first surface 20a of the deposition mask 20.

As illustrated in FIG. 29, the wall surface 31 of the first opening 30 and the wall surface 36 of the second opening 35 are connected via a circumferential connecting portion 41. The connecting portion 41 is a defined by a ridge of an overhang where the wall surface 31 of the first opening 30 inclined with respect to the normal direction of the deposition mask and the wall surface 36 of the second opening 35 inclined with respect to the normal direction of the deposition mask are joined. Further, the connecting portion 41 defines a penetrating portion 42 where the area of the through-hole 25 is the minimum in a plan view of the deposition mask 20.

As illustrated in FIG. 29, the two adjacent through-holes 25 are spaced apart from each other along the plate plane of the deposition mask on a surface on the one side along the normal direction of the deposition mask, that is, on the first surface 20a of the deposition mask 20. That is, when the first opening 30 is produced by etching the metal plate 21 from the first surface 21a side of the metal plate 21 corresponding to the first surface 20a of the deposition mask 20 as in a manufacturing method to be described later, the first surface 21a of the metal plate 21 remains between the two adjacent first openings 30.

Similarly, the two adjacent second openings 35 may be also spaced apart from each other along the plate plane of the deposition mask on the other side along the normal direction of the deposition mask, that is, on the second surface 20b side of the deposition mask 20 as illustrated in FIG. 29. That is, the second surface 21b of the metal plate 21 may remain between the two adjacent second openings 35. In the following description, a portion of the effective region 22 on the second surface 21b of the metal plate 21 that remains without being etched is also referred to as a top portion 43. As the deposition mask 20 is produced so as to leave such a top portion 43, it is possible to make the deposition mask 20 have sufficient strength. As a result, it is possible to suppress the deposition mask 20 from being damaged during transportation, for example. Incidentally, if a width β of the top portion 43 is too large, shadow is generated in the deposition step so that the utilization efficiency of the deposition material 98 may decrease. Therefore, it is preferable that the deposition mask 20 be produced such that the width β of the top portion 43 does not become excessively large. For example, the width β of the top portion 43 is preferably 2 μm or less. Incidentally, the width β of the top portion 43 generally varies depending on a direction in which the deposition mask 20 is cut. For example, the widths β of the top portion 43 illustrated in FIG. 29 may be different from each other. In this case, the deposition mask 20 may be configured such that the width β of the top portion 43 becomes 2 μm or less even when the deposition mask 20 is cut in any direction.

Even in FIG. 29, a path that forms the angle θ1 with respect to the normal direction N of the deposition mask 20 among paths of the deposition material 98 passing through the end 38 of the through-hole 25 (the second opening 35) on the second surface 20b side of the deposition mask 20, the paths that can reach the organic EL substrate 92 is represented by a reference sign L1, which is similar to the case illustrated in FIG. 4. Even in this mode, it is preferable to increase the angle θ1 in order to enhance the utilization efficiency of the deposition material 98. For example, it is preferable to reduce the thickness of the deposition mask 20 as much as possible within a range where the strength of the deposition mask 20 can be secured to increase the angle θ1. For example, the thickness of the deposition mask 20 is set to 80 μm or less, for example, within a range of 10 to 80 μm or within a range of 20 to 80 μm. In order to further improve the accuracy of deposition, the thickness of the deposition mask 20 may be set to 40 μm or less, for example, within a range of 10 to 40 μm or within a range of 20 to 40 μm. Incidentally, the thickness of the deposition mask 20 is a thickness of the surrounding region 23, that is, a thickness of the portion of the deposition mask 20 where the first opening 30 and the second opening 35 are not formed. Therefore, it can be said that the thickness of the deposition mask 20 is the thickness of the metal plate 21.

Next, the method of manufacturing the deposition mask 20 illustrated in FIG. 29 by using etching will be described.

Figure 30:
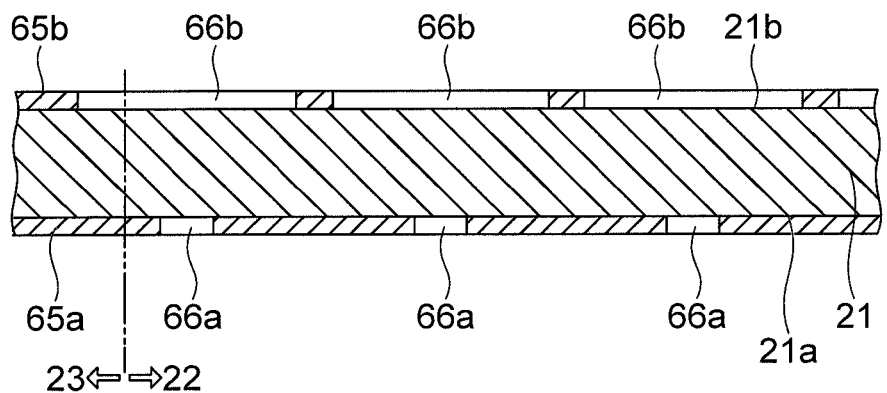
FIG. 30 is a view illustrating one step of an example of a method of manufacturing the deposition mask illustrated in FIG. 29 by etching.

First, the metal plate 21 having a predetermined thickness is prepared. An iron alloy containing nickel or the like can be used as a material forming the metal plate 21. In particular, a rolled material made of such an alloy can be suitably used. Next, a first resist pattern 65a is formed on the first surface 21a of the metal plate 21 with a predetermined gap 66a therebetween as illustrated in FIG. 30. In addition, a second resist pattern 65b is formed on the second surface 21b of the metal plate 21 with a predetermined gap 66b therebetween.

Figure 31:
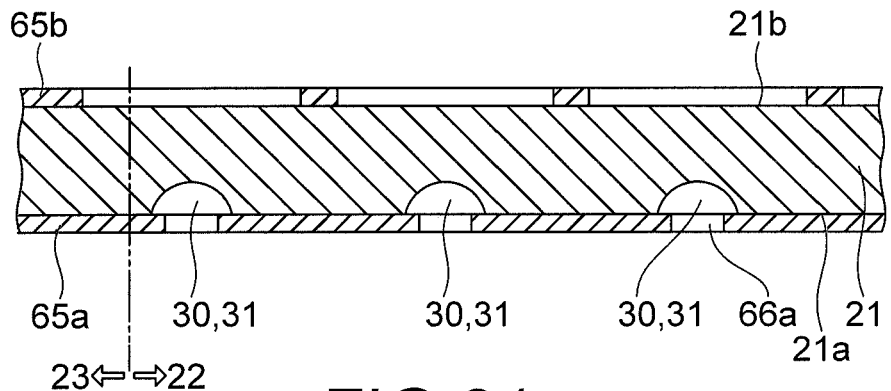
FIG. 31 is a view illustrating one step of an example of the method of manufacturing the deposition mask illustrated in FIG. 29 by etching.

Thereafter, a first surface etching step of etching a region of the first surface 21a of the metal plate 21 that is not covered with the first resist pattern 65a by using a first etching liquid is performed as illustrated in FIG. 31. For example, the first etching liquid is sprayed from a nozzle arranged on the side opposing the first surface 21a of the metal plate 21 toward the first surface 21a of the metal plate 21 through the first resist pattern 65a. As a result, erosion by the first etching solution proceeds in the region of the first surface 21a of the metal plate 21 that is not covered with the first resist pattern 65a as illustrated in FIG. 31. As a result, a large number of the first openings 30 are formed in the first surface 21a of the metal plate 21. For example, a solution containing a ferric chloride solution and hydrochloric acid is used as the first etching solution.

Figure 32:
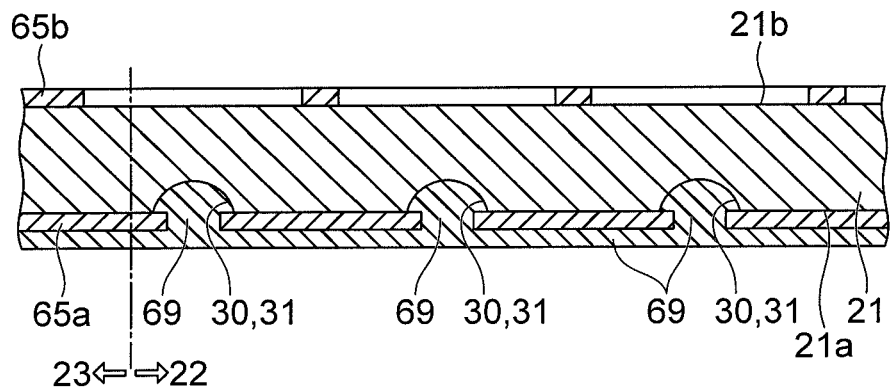
FIG. 32 is a view illustrating one step of an example of the method of manufacturing the deposition mask illustrated in FIG. 29 by etching.

Thereafter, the first opening 30 is covered with a resin 69 having resistance against a second etching solution to be used in the subsequent second surface etching step as illustrated in FIG. 32. That is, the first opening 30 is sealed by the resin 69 having resistance against the second etching solution. In the example illustrated in FIG. 32, a film of the resin 69 is formed so as to cover not only the formed first opening 30 but also the first surface 21a (the first resist pattern 65a) of the metal plate 21.

Figure 33:
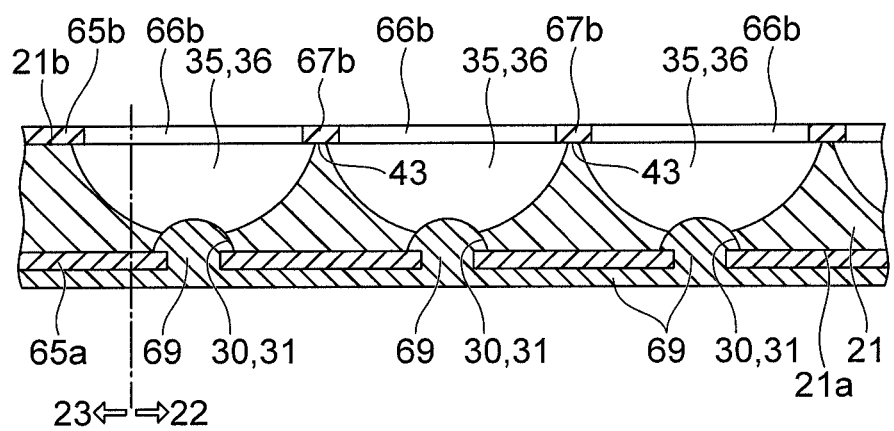
FIG. 33 is a view illustrating one step of an example of the method of manufacturing the deposition mask illustrated in FIG. 29 by etching.

Next, a second surface etching step of etching a region of the second surface 21b of the metal plate 21 that is not covered with the second resist pattern 65b to form the second opening 35 on the second surface 21b is performed as illustrated in FIG. 33. The second surface etching step is performed until the first opening 30 and the second opening 35 communicate with each other to form the through-hole 25. For example, a solution containing a ferric chloride solution and hydrochloric acid is used as the second etching solution, which is similar to the above-described first etching solution.

Incidentally, the erosion by the second etching liquid is performed in a portion of the metal plate 21 which is in contact with the second etching solution. Therefore, the erosion proceeds not only in the normal direction (thickness direction) of the metal plate 21 but also in the direction along the plate plane of the metal plate 21. Here, the second surface etching step is preferably ended before the two second openings 35 respectively formed at positions opposing the two adjacent gaps 66b of the second resist pattern 65b join each other on the back side of a bridge portion 67b positioned between the two gaps 66b. As a result, the above-described top portion 43 can be left on the second surface 21b of the metal plate 21 as illustrated in FIG. 33.

Thereafter, the resin 69 is removed from the metal plate 21. As a result, it is possible to obtain the deposition mask 20 having the plurality of through-holes 25 formed in the metal plate 21. The resin 69 can be removed, for example, by using an alkali-based peeling solution. When the alkali-based peeling solution is used, the resist patterns 65a and 65b can also be removed simultaneously with the resin 69. Incidentally, the resist patterns 65a and 65b may be removed separately from the resin 69 by using a peeling solution different from the peeling solution for peeling the resin 69 after removing the resin 69.

In this manner, according to the present embodiment, in the case where the mask body (the metal layer 28 or the metal plate 21) of the deposition mask 20 satisfies y≥950 and y≥23x−1280 when the indentation elastic modulus is x (GPa) and the 0.2% yield strength is y (MPa), it is possible to suppress generation of recesses on the first surface 20a and the second surface 20b of the deposition mask 20 during ultrasonic cleaning of the deposition mask 20 and to suppress deformation of the deposition mask 20 as will be described in detail later. In particular, even when the thickness of the mask body of the deposition mask 20 is 15 μm or less, it is possible to suppress the generation of recesses. That is, it is possible to precisely produce the organic EL display device having a high pixel density, and it is possible to obtain the deposition mask 20 capable of preventing deformation.

In this manner, according to the present embodiment, in the case where the mask body (the metal layer 28 or the metal plate 21) of the deposition mask 20 satisfies z≥3.7 and z≥0.1x−6.0 when the indentation elastic modulus is x (GPa) and the indentation hardness is z (GPa), it is possible to suppress generation of a recess on the first surface 20a and the second surface 20b of the deposition mask 20 during ultrasonic cleaning of the deposition mask 20 and to suppress deformation of the deposition mask 20 as will be described in detail later. In particular, even when the thickness of the mask body of the deposition mask 20 is 15 μm or less, it is possible to suppress the generation of the recess. That is, it is possible to precisely produce the organic EL display device having a high pixel density, and it is possible to obtain the deposition mask 20 capable of preventing deformation.

Although the embodiment of the present invention has been described in detail as above, the deposition mask, the method of manufacturing a deposition mask, and the metal plate according to the present invention are not limited to the above-described embodiment, and various modifications can be made in a scope not departing from a gist of the present invention.

EXAMPLES

Example 1

The indentation elastic modulus and the 0.2% yield strength of the mask body (the metal layer 28, the metal layer assembly 28', or the metal plate 21) of the deposition mask 20 according to the present embodiment were measured, and ultrasonic cleaning was performed to check presence or absence of a recess generated in one surface between the two surfaces of the mask body (hereinafter referred to as a target surface).

First, various samples were produced for the metal layer assembly 28' ([Mode 2]) having the two-layer structure as the mask body produced by the plating process. A mixed solution containing ferrous sulfamate, nickel sulfamate, boric acid, saccharin, malonic acid, and the like was used as the first plating solution. The temperature of the first plating solution was set to 35° C. to 50° C., and the first metal layer 32' was precipitated using iron pellets and nickel pellets as anodes. The same mixed solution as the first plating solution was used as the second plating solution, and the second metal layer 37' was precipitated under the same conditions as those at the time of precipitating the first metal layer 32'. In this manner, each sample having the two-layer structure formed of the first metal layer 32' and the second metal layer 37' was produced. Annealing treatment (firing treatment) was performed on some of the produced samples of the metal layer assembly 28', and no annealing treatment was performed on the other samples. In this manner, samples of five kinds of the metal layer assembly 28' were produced (Table 4 to be described later and Samples S1 to S5 of FIG. 36). Incidentally, the annealing treatment was carried out at temperature between 100° C. and 600° C. under nitrogen atmosphere for 60 minutes, and the 0.2% yield strength to be described later tended to decrease as the temperature was higher.

In addition, various samples were also produced for the metal layer 28 ([Mode 1]) having the single-layer structure as the mask body produced by the plating process. The same mixed solution as the first plating solution and the second plating solution was used as the plating solution, and the metal layer 28 was precipitated under the same conditions to prepare each sample having the single-layer structure. Annealing treatment (firing treatment) was performed on some of the produced samples of the metal layer 28, and no annealing treatment was performed on the other samples. In this manner, samples of ten kinds of the metal layer 28 were produced (Table 4 to be described later and Samples S6 to S15 of FIG. 36). Incidentally, the annealing treatment was carried out at temperature between 100° C. and 600° C. under nitrogen atmosphere for 60 minutes, and the 0.2% yield strength to be described later tended to decrease as the temperature was higher.

The samples of the metal layer assembly 28' and the samples of the metal layer 28 were formed to have a shape of 40 mm×40 mm and a thickness of 0.5 μm to 25 μm. The above-described through-hole 25 was not formed in these samples. Incidentally, the thickness varies depending on the samples, but it is considered that there is no influence on the measurement of the indentation elastic modulus and the 0.2% yield strength and the generation of the recess during the ultrasonic cleaning with such a degree of difference.

Two kinds of samples were produced for the metal plate 21 ([Mode 4]) as the mask body produced by the etching process (Table 4 to be described later and Samples S16 and S17 of FIG. 36). Here, YET 36 (containing 35 to 37% by mass of nickel, iron, and other trace components) which is a 36 Ni—Fe alloy manufactured by Hitachi Metals, Ltd. was used as a rolled material. No annealing treatment was performed on the produced samples of the metal plate 21. In addition, shapes of the samples of the metal plate 21 were the same as the shapes of the samples of the metal layer assembly 28' and the metal layer 28, and the through-hole 25 was not formed.

Next, a nano-indentation test was performed with respect to each produced sample to measure the indentation elastic modulus of each sample. For the measurement, a nanoindenter (TriboIndenter, TI950, manufactured by Hysitron, Inc.) was used. For an indenter, a triangular pyramidal indenter made of diamond (Berkovich indenter, No. TI 0039-10251012) was used. The nano-indentation test was carried out at room temperature (23° C. to 25° C.).

Figure 34:
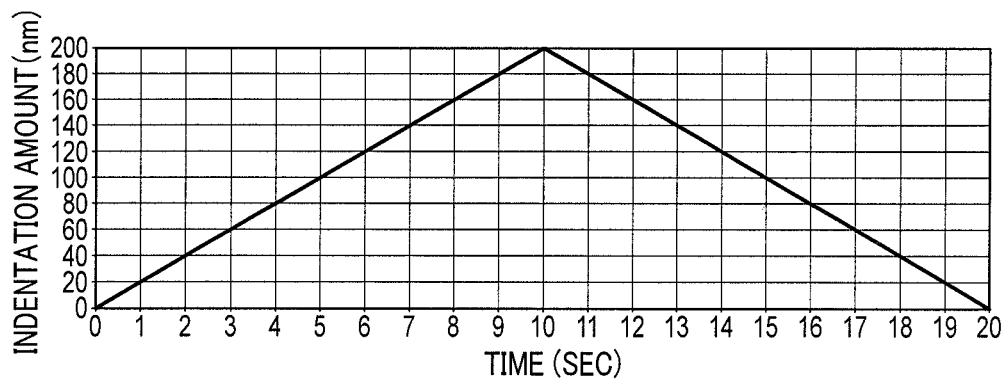
FIG. 34 is a graph illustrating transition of an indentation amount of an indenter when measuring an indentation elastic modulus of a sample.

During the measurement, the indenter was pushed into the sample to a depth of 200 nm as an indentation process as illustrated in FIG. 34. The indentation speed of the indenter at this time was 20 nm/sec. Thereafter, the indenter which has been indented into the sample was pulled out. The pull-out speed of the indenter at this time was 20 nm/sec.

During the indentation process and the unloading process illustrated in FIG. 34, an indentation load P and an indentation amount h of the indenter were measured, a maximum load $P_{max}$ among the measured indentation loads P was obtained, and a contact area $A_C$ between the indenter and the sample was obtained based on the indentation amount h when the maximum load $P_{max}$ was loaded on the indenter. Incidentally, the measurement of the indentation load P and the indentation amount h and the calculation of the maximum load $P_{max}$ and the contact area $A_C$ were performed inside the nanoindenter. Based on the maximum load $P_{max}$ and the contact area $A_C$ obtained in this manner, an indentation elastic modulus $E_r$ was obtained using the following formula.

$$E_r = \frac{S\sqrt{\pi}}{2\sqrt{A_C}} \quad \text{[Expression 1]}$$

Here, S represents stiffness (contact stiffness) in the unloading process, and is expressed by the following formula.

$$S = \frac{dP}{dh} \quad \text{[Expression 2]}$$

In this manner, the indentation elastic modulus $E_r$ is obtained based on a relationship between the indentation load P and the indentation amount h in the unloading process, and is sometimes referred to as a decrease elastic modulus or a return elastic modulus.

Incidentally, the nanoindenter was used to perform the measurement of the indentation load P and the indentation amount h, and the calculation of the indentation elastic modulus $E_r$.

For measurement of the 0.2% yield strength, a digital material tester 5581 manufactured by Instron was used. The 0.2% yield strength was measured at room temperature. A specimen was formed in a dumbbell shape (No. 5 prescribed in JIS K6251). A tensile load was applied at test speed of 1 mm/min. For elongation measurement, a non-contact video extensometer AVE manufactured by Instron was used. A distance between gauges serving references of elongation measurement was set to 25 mm. A stress-strain curve was obtained based on a relationship between the tensile load and the elongation of the specimen, and the 0.2% yield strength was obtained from this curve.

The indentation elastic modulus and the 0.2% yield strength obtained in each sample are shown in Table 4 to be described later.

Next, the ultrasonic cleaning of each sample was performed to check the presence or absence of generation of the recess.

Figure 35:
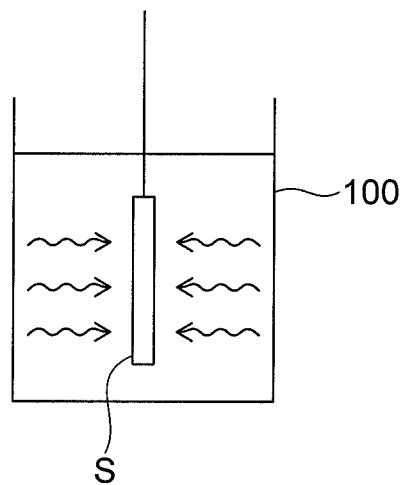
FIG. 35 is a view for describing an ultrasonic test method of the sample.

Specifically, first, a cleaning solution was stored inside a cleaning tank 100, and a sample S was immersed in the cleaning solution as illustrated in FIG. 35. As the cleaning solution, N-methylpyrrolidone (NMP) as a solvent was used. The temperature of the cleaning solution was adjusted to 40° C. In addition, the sample S was immersed so as to be suspended in the cleaning solution such that an upper end of the sample was held. As a result, the target surface of the sample S was arranged along the vertical direction. Incidentally, ultrasonic cleaning is generally performed by holding both ends of the deposition mask 20 during the ultrasonic cleaning. It is considered that the recess is generated more easily in the case where only the one end of the sample S is held to suspend the sample S as described above than in the general case, and a severe condition was adopted regarding the generation of the recess.

The target surface of this sample was irradiated with ultrasonic waves at 20 kHz for 30 minutes in the horizontal direction (a direction perpendicular to the target surface of the sample) to perform the ultrasonic cleaning of the sample. Incidentally, the frequency of the ultrasonic wave to be emitted at the time of performing the ultrasonic cleaning is generally higher than 20 kHz. Here, however, the frequency was set to be lower than the general frequency in consideration of an acceleration test.

After being irradiated with the ultrasonic waves, the sample was taken out to check the presence or absence of generation of the recess on the target surface. When the recess was generated, the number of generated recesses was counted. Results thereof are shown in the following Table 4. Incidentally, the recess was checked using an image obtained by magnifying the target surface of the sample with a stereoscopic microscope (manufactured by Nikon Corporation, a model type SMZ 645) at a total magnification of 50 times under reflected illumination. In addition, the number of generated recesses in Table 4 represents an averaged value of results obtained by preparing 17 pieces of each sample.

TABLE 4

| No. | INDENTATION ELASTIC MODULUS (GPa) | 0.2% YIELD STRENGTH (MPa) | NUMBER OF GENERATED RECESSES (AVERAGE) | GOOD OR BAD DETERMINATION |
|---|---|---|---|---|
| S1 | 76.7 | 1387 | 0.0 | ○ |
| S2 | 109.1 | 1346 | 0.5 | ○ |
| S3 | 52.8 | 1125 | 0.0 | ○ |
| S4 | 90.0 | 1289 | 0.0 | ○ |
| S5 | 92.8 | 1422 | 0.0 | ○ |
| S6 | 96.5 | 910 | 34.7 | X |
| S7 | 97.7 | 1010 | 0.4 | ○ |
| S8 | 95.1 | 1057 | 0.0 | ○ |
| S9 | 98.2 | 951 | 9.8 | X |
| S10 | 96.7 | 986 | 0.4 | ○ |
| S11 | 81.0 | 899 | 5.5 | X |
| S12 | 111.4 | 893 | 78.6 | X |
| S13 | 105.0 | 1049 | 6.1 | X |
| S14 | 108.0 | 983 | 47.0 | X |
| S15 | 112.4 | 1023 | 18.6 | X |
| S16 | 98.4 | 823 | 111.6 | X |
| S17 | 106.5 | 789 | 161.5 | X |

Good or bad of each sample was determined based on the number of generated recesses of one or smaller. Based on this good or bad determination, good or bad of each sample was determined as shown in Table 4.

Figure 36:
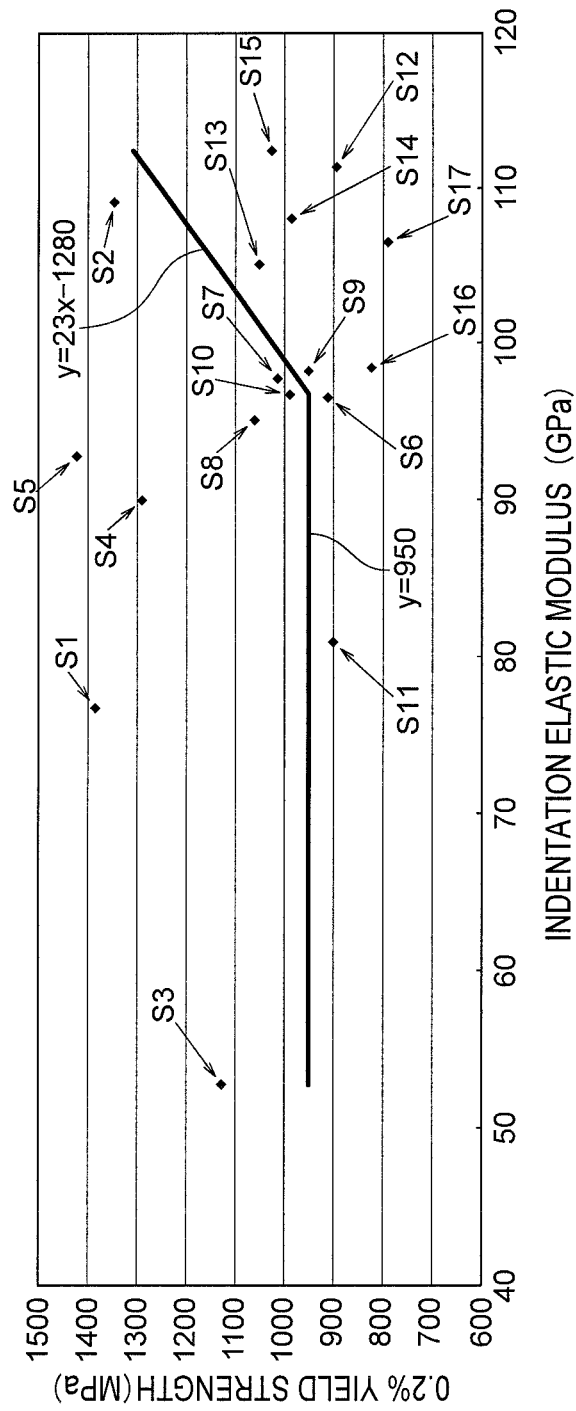
FIG. 36 is a graph illustrating a relationship between an indentation elastic modulus and the 0.2% yield strength of each sample.

Each sample illustrated in Table 4 was plotted in FIG. 36. In FIG. 36, the horizontal axis represents the indentation elastic modulus and the vertical axis represents the 0.2% yield strength.

As illustrated in FIG. 36, it is understood that an area where a group of samples determined to be good is present and an area where a group of samples determined to be bad is present are clearly divided among the respective plotted samples. More specifically, roughly, the samples determined to be bad are present in a range where the 0.2% yield strength is small, and the samples determined to be good are present in a range where the 0.2% yield strength is large.

Further, it can be said that there is a clear boundary line between the groups of these samples. It is understood that the boundary line can be defined by a line where the 0.2% yield strength is constant within a range where the indentation elastic modulus is smaller than a predetermined value (about 97 in FIG. 36). More specifically, if the 0.2% yield strength is y (MPa), the boundary line can be defined by y=950. That is, in this range of the indentation elastic modulus, the group of samples determined to be bad is present in a range where the 0.2% yield strength is smaller than the boundary line of y=950, and the group of samples determined to be good is present in a range larger than the boundary line.

On the other hand, it is understood that the 0.2% yield strength can be defined by a line indicating a linear function of indentation elastic modulus in a range where the indentation elastic modulus is larger than the above-described predetermined value. More specifically, if the indentation elastic modulus is x (GPa) and the 0.2% yield strength is y (MPa), the boundary line can be defined by y=23x−1280. That is, in this range of the indentation elastic modulus, the group of samples determined to be bad is present in a range where the 0.2% yield strength is smaller than the boundary line of y=23x−1280, and the group of samples determined to be good is present in a range larger than the boundary line.

Therefore, the indentation elastic modulus of x (GPa) and the 0.2% yield strength of y (MPa) satisfy y≥950 and y≥23x−1280, it is possible to obtain the mask body (the metal layer 28, the metal layer assembly 28', or the metal plate 21) of the deposition mask 20 capable of reducing the possibility of generation of the recess during the ultrasonic cleaning or preventing generation of the recess.

Incidentally, the samples S1 to S6 in Example 1 correspond to the metal layer assembly 28' ([Mode 2]) having the two-layer structure as described above. All of these samples S1 to S6 were determined to be good, and there was no sample determined to be bad. However, although the metal layer assembly 28' of Mode 2 and the metal layer 28 of Mode 1 are different in terms of the layer structure, it is difficult to consider that the difference in the layer structure affects generation of the recess, and thus, it is considered that the metal layer assembly 28' of Mode 2 also exhibits the same tendency as that of the metal layer 28 of Mode 1. Thus, even with the metal layer assembly 28' of Mode 2, it is possible to obtain the mask body (the metal layer assembly 28') of the deposition mask 20 capable of reducing the possibility of generation of the recess during the ultrasonic cleaning or preventing generation of the recess by satisfying the above-described formula.

In addition, the metal layer assembly 28' of Mode 3 and the metal layer assembly 28' of Mode 2 are merely different from each other in terms that the base on which the first metal layer 32' is precipitated is the base material 51" on which the first resist pattern 60A is formed or the conductive pattern 52' formed on the base material 51', and there is no difference in the method of precipitating the second metal layer 37'. As a result, it is considered that the metal layer assembly 28' of Mode 3 also shows the same tendency as the metal layer assembly 28' of Mode 2 (more specifically, the metal layer 28 of Mode 1). Thus, even with the metal layer assembly 28' of Mode 3, it is possible to obtain the mask body (the metal layer assembly 28') of the deposition mask 20 capable of reducing the possibility of generation of the recess during the ultrasonic cleaning or preventing generation of the recess by satisfying the above-described formula.

Example 2

The indentation elastic modulus and the indentation hardness of the mask body (the metal layer 28, the metal layer assembly 28', or the metal plate 21) of the deposition mask 20 according to the present embodiment were measured, and ultrasonic cleaning was performed to check presence or absence of a recess generated in one surface between the two surfaces of the mask body (hereinafter referred to as a target surface).

First, five kinds of samples of the metal layer assembly 28' were produced in the same manner as the above-described Example 1 for the metal layer assembly 28' ([Mode 2]) having the two-layer structure as the mask body produced by the plating process (Table 5 to be described later and Samples S1 to S5 of FIG. 37). Incidentally, the annealing treatment was carried out at temperature between 100° C. and 600° C. under nitrogen atmosphere for 60 minutes, and the indentation hardness to be described later tended to decrease as the temperature was higher.

In addition, ten kinds of samples of the metal layers 28 were produced in the same manner as the above-described Example 1 for the metal layer 28 ([Mode 1]) having the single-layer structure as the mask body produced by the plating process (Table 5 to be described later and Samples S6 to S15 of FIG. 37). Incidentally, the annealing treatment was carried out at temperature between 100° C. and 600° C. under nitrogen atmosphere for 60 minutes, and the indentation elastic modulus to be described later tended to decrease as the temperature was higher.

The samples of the metal layer assembly 28' and the samples of the metal layer 28 were formed to have a shape of 40 mm×40 mm and a thickness of 0.5 μm to 25 μm. The above-described through-hole 25 was not formed in these samples. Incidentally, the thickness varies depending on the samples, but it is considered that there is no influence on the measurement of the indentation elastic modulus and the indentation hardness and the generation of the recess during the ultrasonic cleaning, with such a degree of difference.

In addition, two kinds of samples were produced in the same manner as the above-described Example 1 for the metal plate 21 ([Mode 4]) as the mask body produced by the etching process (Table 5 to be described later and Samples S16 and S17 of FIG. 37).

Next, a nano-indentation test was performed with respect to each produced sample to measure the indentation elastic modulus and indentation hardness of each sample. Measurement of the indentation elastic modulus and measurement of the indentation hardness in Example 2 were carried out in the same manner as in Example 1.

An indentation hardness $H_{IT}$ was obtained using the following formula based on the maximum load $P_{max}$ and the contact area $A_C$ obtained in the same manner as in Example 1.

$$H_{IT} = \frac{P_{max}}{A_C} \qquad \text{[Expression 3]}$$

Incidentally, the nanoindenter was used to perform the measurement of the indentation load P and the indentation amount h, and the calculation of the indentation elastic modulus $E_r$ and the indentation hardness $H_{IT}$.

The indentation elastic modulus and the indentation hardness obtained in each sample are shown in Table 5 to be described later.

Next, the ultrasonic cleaning of each sample was performed to check the presence or absence of generation of the recess.

The ultrasonic cleaning was carried out in the same manner as in Example 1, and the sample was taken out to check the presence or absence of generation of the recess on the target surface after being irradiated with the ultrasonic waves. When the recess was generated, the number of generated recesses was counted. Results thereof are shown in the following Table 5. Incidentally, the recess was checked in the same manner as in Example 1. The number of generated recesses in Table 5 represents an averaged value of results obtained by preparing 17 pieces of each sample.

hardness is small, and the samples determined to be good are present in a range where the indentation hardness is large.

Further, it can be said that there is a clear boundary line between the groups of these samples. It is understood that the boundary line can be defined by a line where the indentation hardness is constant within a range where the indentation elastic modulus is smaller than a predetermined value (about 97 in FIG. 37). More specifically, if the indentation hardness is z (GPa), the boundary line can be defined by z=3.7. That is, in this range of the indentation elastic modulus, the group of samples determined to be bad is present in a range where the indentation hardness is smaller than the boundary line of z=3.7, and the group of samples determined to be good is present in a range larger than the boundary line.

On the other hand, it is understood that the indentation hardness can be defined by a line indicating a linear function of indentation elastic modulus in a range where the indentation elastic modulus is larger than the above-described predetermined value. More specifically, if the indentation elastic modulus is x (GPa) and the indentation hardness is z (GPa), the boundary line can be defined by z=0.1x−0.6. That is, in this range of the indentation elastic modulus, the group of samples determined to be bad is present in a range where the indentation hardness is smaller than the boundary line of z=0.1x−0.6, and the group of samples determined to be good is present in a range larger than the boundary line.

Therefore, the indentation elastic modulus of x (GPa) and the indentation hardness z (GPa) satisfy z≥3.7 and z≥0.1x≥6.0, it is possible to obtain the mask body (the metal

TABLE 5

| No. | INDENTATION ELASTIC MODULUS (GPa) | INDENTATION HARDNESS (GPa) | NUMBER OF GENERATED RECESSES | GOOD OR BAD DETERMINATION |
|---|---|---|---|---|
| S1 | 76.7 | 5.5 | 0.0 | ○ |
| S2 | 109.1 | 5.6 | 0.5 | ○ |
| S3 | 52.8 | 4.6 | 0.0 | ○ |
| S4 | 90.0 | 5.1 | 0.0 | ○ |
| S5 | 92.8 | 6.1 | 0.0 | ○ |
| S6 | 96.5 | 3.5 | 34.7 | X |
| S7 | 97.7 | 4.0 | 0.4 | ○ |
| S8 | 95.1 | 4.2 | 0.0 | ○ |
| S9 | 98.2 | 3.7 | 9.8 | X |
| S10 | 96.7 | 3.8 | 0.4 | ○ |
| S11 | 81.0 | 3.5 | 5.5 | X |
| S12 | 111.4 | 3.4 | 78.6 | X |
| S13 | 105.0 | 4.2 | 6.1 | X |
| S14 | 108.0 | 3.8 | 47.0 | X |
| S15 | 112.4 | 4.0 | 18.6 | X |
| S16 | 98.4 | 3.1 | 111.6 | X |
| S17 | 106.5 | 3.0 | 161.5 | X |

Good or bad of each sample was determined based on the number of generated recesses of one or smaller. Based on this good or bad determination, good or bad of each sample was determined as shown in Table 5.

Figure 37:
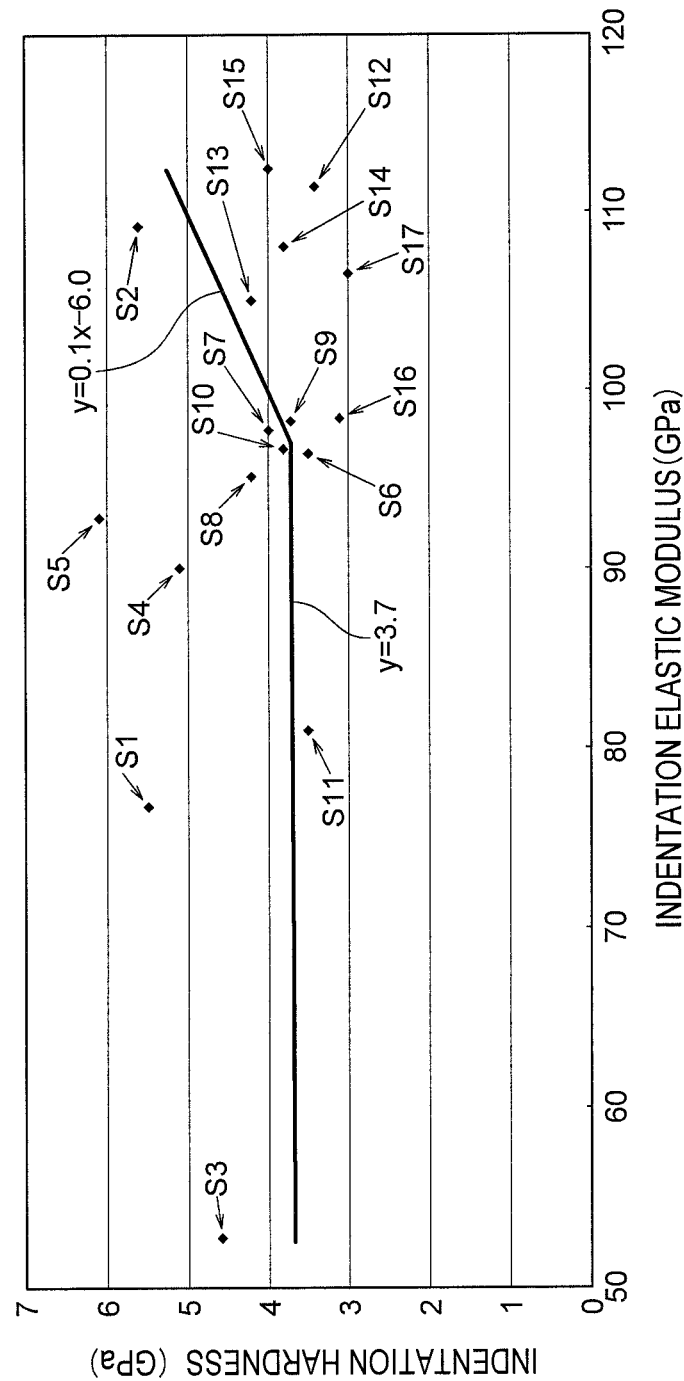
FIG. 37 is a view illustrating a relationship between an indentation elastic modulus and an indentation hardness of each sample.

Each sample illustrated in Table 5 was plotted in FIG. 37. In FIG. 37, the horizontal axis represents the indentation elastic modulus, and the vertical axis represents the indentation hardness.

As illustrated in FIG. 37, it is understood that an area where a group of samples determined to be good is present and an area where a group of samples determined to be bad is present are clearly divided among the respective plotted samples. More specifically, roughly, the samples determined to be bad are present in a range where the indentation layer 28, the metal layer assembly 28', or the metal plate 21) of the deposition mask 20 capable of reducing the possibility of generation of the recess during the ultrasonic cleaning or preventing generation of the recess.

Incidentally, the samples S1 to S6 in Example 2 correspond to the metal layer assembly 28' ([Mode 2]) having the two-layer structure as described above. All of these samples S1 to S6 were determined to be good, and there was no sample determined to be bad. However, although the metal layer assembly 28' of Mode 2 and the metal layer 28 of Mode 1 are different in terms of the layer structure, it is difficult to consider that the difference in the layer structure affects generation of the recess, and thus, it is considered that the metal layer assembly 28' of Mode 2 also exhibits the same tendency as that of the metal layer 28 of Mode 1. Thus, even with the metal layer assembly 28' of Mode 2, it is possible to obtain the mask body (the metal layer assembly 28') of the deposition mask 20 capable of reducing the possibility of generation of the recess during the ultrasonic cleaning or preventing generation of the recess by satisfying the above-described formula.

In addition, the metal layer assembly 28' of Mode 3 and the metal layer assembly 28' of Mode 2 are merely different from each other in terms that the base on which the first metal layer 32' is precipitated is the base material 51" on which the first resist pattern 60A is formed or the conductive pattern 52' formed on the base material 51', and there is no difference in the method of precipitating the second metal layer 37'. As a result, it is considered that the metal layer assembly 28' of Mode 3 also shows the same tendency as the metal layer assembly 28' of Mode 2 (more specifically, the metal layer 28 of Mode 1). Thus, even with the metal layer assembly 28' of Mode 3, it is possible to obtain the mask body (the metal layer assembly 28') of the deposition mask 20 capable of reducing the possibility of generation of the recess during the ultrasonic cleaning or preventing generation of the recess by satisfying the above-described formula.

The invention claimed is:

1. A deposition mask for depositing a deposition material on a deposition target substrate, the deposition mask comprising:
    a mask body; and
    a through-hole provided in the mask body and through which the deposition material passes when the deposition material is deposited on the deposition target substrate,
    wherein the mask body satisfies $$y \geq 950 \text{ and } y \geq 23x-1280$$

when an indentation elastic modulus is x (GPa) and a 0.2% yield strength is y (MPa),
    wherein the indentation elastic modulus is 52.8 GPa-109.1 GPa, and
    wherein the mask body has a first plated metal layer and a second plated metal layer provided on the first plated metal layer.

2. The deposition mask according to claim 1, wherein a thickness of the mask body is 15 μm or less.

3. A deposition mask for depositing a deposition material on a deposition target substrate, the deposition mask comprising:
    a mask body; and
    a through-hole provided in the mask body and through which the deposition material passes when the deposition material is deposited on the deposition target substrate,
    wherein the mask body satisfies $$z \geq 3.7 \text{ and } z \geq 0.1x-6.0$$

when an indentation elastic modulus is x (GPa) and an indentation hardness is z (GPa),
    wherein the indentation elastic modulus is 52.8 GPa-109.1 GPa, and
    wherein the mask body has a first plated metal layer and a second plated metal layer provided on the first plated metal layer.

4. The deposition mask according to claim 3, wherein a thickness of the mask body is 15 μm or less.

5. A method of manufacturing a deposition mask for depositing a deposition material on a deposition target substrate, the method comprising:

a step of forming a mask body, provided with a through-hole through which the deposition material passes when the deposition material is deposited on the deposition target substrate, on a base material by a plating process; and
    a step of separating the mask body from the base material, wherein the mask body satisfies $$y \geq 950 \text{ and } y \geq 23x-1280$$

when an indentation elastic modulus is x (GPa) and a 0.2% yield strength is y (MPa),
    wherein the indentation elastic modulus is 52.8 GPa-109.1 GPa,
    wherein the mask body has a first plated metal layer and a second plated metal layer provided on the first metal layer, and
    wherein the step of forming the mask body includes: a first film formation step of forming the first metal layer provided with a first opening forming the through-hole; and a second film formation step of forming the second metal layer provided with a second opening communication with the first opening on the first metal layer, the second film formation step to obtain the mask body having the first metal layer and the second metal layer.

6. The method of manufacturing a deposition mask according to claim 5, wherein
    the second film formation step includes: a resist formation step of forming a resist pattern on the base material and on the first metal layer with a predetermined gap therebetween; and a plating process step of precipitating the second metal layer on the first metal layer in the gap of the resist pattern, and
    the resist formation step is performed such that the first opening of the first metal layer is covered with the resist pattern and the gap of the resist pattern is positioned on the first metal layer.

7. The method of manufacturing a deposition mask according to claim 6, wherein
    the plating process step of the second film formation step includes an electrolytic plating process step of causing an electric current to flow through the first metal layer to precipitate the second metal layer on the first metal layer.

8. The method of manufacturing a deposition mask according to claim 5, wherein
    the base material has an insulating property,
    a conductive pattern having a pattern corresponding to the first metal layer is formed on the base material, and
    the first film formation step includes a plating process step of precipitating the first metal layer on the conductive pattern.

9. The method of manufacturing a deposition mask according to claim 8, wherein
    the plating process step of the first film formation step includes an electrolytic plating process step of causing an electric current to flow through the conductive pattern to precipitate the first metal layer on the conductive pattern.

10. The method of manufacturing a deposition mask according to claim 5, wherein
    the first film formation step includes a resist formation step of forming a resist pattern on the base material with a predetermined gap therebetween and a plating process step of precipitating the first metal layer on the base material in the gap of the resist pattern, and a portion of a front surface of the base material on which the first metal layer is precipitated is formed of a conductive layer having conductivity.

11. The method of manufacturing a deposition mask according to claim 10, wherein
the plating process step of the first film formation step includes an electrolytic plating process step of causing an electric current to flow through the base material to precipitate the first metal layer on the base material.

12. A method of manufacturing a deposition mask for depositing a deposition material on a deposition target substrate, the method comprising:
a step of forming a mask body, provided with a through-hole through which the deposition material passes when the deposition material is deposited on the deposition target substrate, on a base material by a plating process; and
a step of separating the mask body from the base material, wherein the mask body satisfies $$z \geq 3.7 \text{ and } z \geq 0.1x - 6.0$$

when an indentation elastic modulus is x (GPa) and an indentation hardness is z (GPa),
wherein the indentation elastic modulus is 52.8 GPa-109.1 GPa,
wherein the mask body has a first plated metal layer and a second plated metal layer provided on the first metal layer, and
wherein the step of forming the mask body includes: a first film formation step of forming the first metal layer provided with a first opening forming the through-hole; and a second film formation step of forming the second metal layer provided with a second opening communicating with the first opening on the first metal layer, the second film formation step to obtain the mask body having the first metal layer and the second metal layer.

13. The method of manufacturing a deposition mask according to claim 12, wherein
the second film formation step include: a resist formation step of forming a resist pattern on the base material and on the first metal layer with a predetermined gap therebetween; and a plating process step of precipitating the second metal layer on the first metal layer in the gap of the resist pattern, and
the resist formation step is performed such that the first opening of the first metal layer is covered with the resist pattern and the gap of the resist pattern is positioned on the first metal layer.

14. The method of manufacturing a deposition mask according to claim 13, wherein
the plating process step of the second film formation step includes an electrolytic plating process step of causing an electric current to flow through the first metal layer to precipitate the second metal layer on the first metal layer.

15. The method of manufacturing a deposition mask according to claim 12, wherein
the base material has an insulating property,
a conductive pattern having a pattern corresponding to the first metal layer is formed on the base material, and
the first film formation step includes a plating process step of precipitating the first metal layer on the conductive pattern.

16. The method of manufacturing a deposition mask according to claim 15, wherein
the plating process step of the first film formation step includes an electrolytic plating process step of causing an electric current to flow through the conductive pattern to precipitate the first metal layer on the conductive pattern.

17. The method of manufacturing a deposition mask according to claim 12, wherein
the first film formation step includes a resist formation step of forming a resist pattern on the base material with a predetermined gap therebetween and a plating process step of precipitating the first metal layer on the base material in the gap of the resist pattern, and
a portion of a front surface of the base material on which the first metal layer is precipitated is formed of a conductive layer having conductivity.

18. The method of manufacturing a deposition mask according to claim 17, wherein
the plating process step of the first film formation step includes an electrolytic plating process step of causing an electric current to flow through the base material to precipitate the first metal layer on the base material.

* * * * *